United States Patent
Kuroiwa et al.

(10) Patent No.: US 6,239,460 B1
(45) Date of Patent: *May 29, 2001

(54) SEMICONDUCTOR DEVICE WHICH INCLUDES A CAPACITOR HAVING A LOWER ELECTRODE FORMED OF IRIDIUM OR RUTHENIUM

(75) Inventors: Takeharu Kuroiwa; Tsuyoshi Horikawa; Tetsuro Makita; Noboru Mikami; Teruo Shibano, all of Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/671,632

(22) Filed: Jun. 28, 1996

(30) Foreign Application Priority Data

Jun. 30, 1995 (JP) ...................................... 7-166092

(51) Int. Cl.[7] ......................... H01L 27/108; H01L 29/76; H01L 29/94; H01L 31/119
(52) U.S. Cl. ......................... 257/300; 257/303; 257/306; 257/310; 438/253; 438/396
(58) Field of Search .................................... 257/296, 300, 257/303, 306, 310; 438/253, 396

(56) References Cited

U.S. PATENT DOCUMENTS

| | | | |
|---|---|---|---|
| 4,765,845 | * 8/1988 | Takada et al. | 257/751 |
| 4,982,309 | 1/1991 | Shepherd . | |
| 5,122,923 | 6/1992 | Matsubara et al. . | |
| 5,352,622 | * 10/1994 | Chung | 438/3 |
| 5,418,388 | * 5/1995 | Okudaira et al. | 257/295 |
| 5,436,477 | * 7/1995 | Hashizume et al. | 257/310 |
| 5,573,979 | * 11/1996 | Tsu et al. | 438/238 |
| 5,576,564 | * 11/1996 | Satoh et al. | 257/295 |
| 5,585,300 | * 12/1996 | Summerfelt | 505/330 |

FOREIGN PATENT DOCUMENTS

| | | |
|---|---|---|
| 03087055A | 4/1991 | (JP) . |
| 03257858A | 11/1991 | (JP) . |

* cited by examiner

*Primary Examiner*—Olik Chaudhuri
*Assistant Examiner*—Howard Weiss

(57) ABSTRACT

A semiconductor device such as DRAM including a capacitor, wherein a lower electrode of the capacitor is a metal electrode, the metal electrode being mainly composed of ruthenium or iridium, and being connected directly to a capacitor dielectric film through no oxide layer of materials of the metal electrode formed on the surface of the metal electrode. The lower electrode made of iridium or ruthenium can easily be processed as compared with the conventional case where platinum is employed to form the electrode and also can not be oxidized when the capacitor dielectric film is formed, thus reduction in the capacitance can be prevented.

7 Claims, 16 Drawing Sheets

SEMICONDUCTOR DEVICE WHICH INCLUDES A CAPACITOR HAVING A LOWER ELECTRODE FORMED OF IRIDIUM OR RUTHENIUM

BACKGROUND OF THE INVENTION

1. Field of the Invention

The present invention relates to a semiconductor device and a manufacturing method thereof, and more particularly to a structure of DRAM (Dynamic Random Access Memory) including a capacitor dielectric film made of a material having a large dielectric constant and a manufacturing method therefor.

2. Related Background Art

Hitherto, DRAM has been widely employed as one of semiconductor devices permitting information to be input and output randomly. In general, DRAM has a memory cell array portion serving as a storage region for storing a multiplicity of information items to be stored and peripheral circuit portions required to input and output information to and from outside.

FIG. 21 is a block diagram showing the structure of a general DRAM.

As shown in FIG. 21, a DRAM 150 has a memory cell array 151 for storing information, a row-and-column address buffer 152 for receiving, from outside, an address signal for selecting a memory cell forming a unit storage circuit, a row decoder 153 and a column decoder 154 which decode the address signal to appoint a memory cell, a sense refresh amplifier 155 for amplifying and reading signals stored in the appointed memory cell, a data-in buffer 156 and a data-out buffer 157 for inputting and outputting data, and a clock generator 158 for generating a clock signal.

The memory cell array 151 having a large area on the semiconductor chip has a plurality of memory cells arranged to store unit storage information and formed into a matrix configuration. In general, one memory cell is composed of one MOS (Metal Oxide Semiconductor) transistor and one capacitor connected to the MOS transistor. A memory cell of the foregoing type is called a 1-transistor and 1-capacitor type memory cell. Since a memory cell of this type has a simple structure, the degree of integration of the memory cell array 151 can easily be raised. Therefore, the foregoing memory cells have been employed widely in DRAM having large capacities.

The memory cells of the DRAM can be classified into some types depending upon the structure of the capacitor. Capacitors of a type called a stacked capacitor are included in the capacitors of the memory cells. The stacked capacitor has a structure such that the major portion of the capacitor is extended to the position above the gate electrode and the field oxide film so that the areas of the opposite portions of the electrodes of the capacitors are enlarged.

Since the stacked capacitor has the foregoing characteristic, a required capacity of the capacitor can easily be obtained even if the device is fined due to raising of the degree of integration of the semiconductor device. As a result, stacked capacitors have been employed widely in the trend of the degree of integration of the semiconductor devices being raised. However, if the stacked capacitor is employed in a further fined device, for example, a 256 M bit DRAM, a predetermined capacity of the capacitor cannot easily be obtained with the foregoing stacked capacitor.

Accordingly, the capacity of the capacitor has been enlarged by performing an attempt such that a dielectric film, for example, PZT (lead zirconate titanate) having a large dielectric constant, is employed as the dielectric film for the capacitor. FIG. 22 shows an example of a DRAM comprising a dielectric film for a capacitor, the dielectric film being made of a material, such as, PZT, having a large dielectric constant.

As shown in FIG. 22, a P-type semiconductor substrate 101 has a major surface in which a field oxide film 102 is formed in a device separated region of the major surface. A device region on the major surface of the semiconductor substrate 101 has transfer gate transistors 103a and 103b formed thereon.

The transfer gate transistor 103a has a gate electrode 104b formed, through a gate insulating film 105, on a channel region 121 between N-type impurity regions 106c and 106a formed apart from each other on the major surface of the semiconductor substrate 101 to serve as source and drain regions.

The transfer gate transistor 103b has a gate electrode 104c formed, through the gate insulating film 105, on the N-type impurity regions 106a and 106b, serving as the source and drain regions, and the channel region 121 between the impurity regions 106a and 106b.

On the field oxide film 102, there is extended a gate electrode 104d of another transfer gate transistor. An oxide film 107 is formed to cover the gate electrodes 104b, 104c and 104d. On the impurity region 106a, there is formed a buried bit line 108 so as to be electrically connected to the impurity region 106a. An insulating layer 109 is formed to cover the buried bit line 108.

A first interlayer insulating film 110 is formed to cover the insulating film 109 and the oxide film 107. The top surface of the first interlayer insulating film 110 is flattened. The first interlayer insulating film 110 has a contact hole 110a in a portion above the impurity region 106b.

A plug 111, electrically connected to the impurity region 106b, is formed in the contact hole 110a. A lower electrode 114 of the capacitor, made of platinum or the like, is formed between the top surface of the plug 111 and that of the first interlayer insulating film 110.

A capacitor dielectric film 115 is formed to cover the lower electrode 114 of the capacitor. The capacitor dielectric film 115 is made of PZT, $SrTiO_3$ or the like. An upper electrode 116 of the capacitor is formed to cover the capacitor dielectric film 115. The upper electrode 116 of the capacitor is, in general, made of platinum.

A second interlayer insulating film 117 is formed to cover the upper electrode 116 of the capacitor. The top surface of the second interlayer insulating film 117 is flattened. A first aluminum line layer 118 is formed above the second interlayer insulating film 117 while being part from the same. A protective film 119 is formed to cover the first aluminum line layer 118. An aluminum line layer 120 is formed on the protective film 119.

The lower electrode 114 of the capacitor, the capacitor dielectric film 115 and the upper electrode 116 of the capacitor form a capacitor 160.

However, the conventional DRAM suffers from the following problems: the conventional DRAM has included the platinum films to form the lower electrode of the capacitor, electrically connected to the major surface of the semiconductor substrate through the opening in the interlayer insulating film, and the upper electrode of the capacitor formed on the capacitor dielectric film.

1) Although the platinum film has an advantage that it does not easily form a reactive layer in the interface with the dielectric film, the platinum film has a poor reactivity and, therefore, it cannot easily be processed.

2) Known materials except platinum, for example, ruthenium, iridium and the like, for forming the electrode, have a problem of a poor adherence with the silicon oxide film serving as the interlayer insulating film when the foregoing material is formed into a thin film.

3) When the capacitor dielectric film is formed, oxidation of the silicon plug taking place due to oxidation of the foregoing material for forming the electrode cannot be prevented. Thus, the contact resistance will be enlarged excessively and the capacitance is reduced undesirably.

4) Moreover, if the material for forming the electrode, such as ruthenium or iridium, is oxidized, the surface of the material is roughened unintentionally, thus raising a problem in that a leakage current is enlarged excessively. In a case where a metal electrode, made of ruthenium or iridium, is formed and then the metal electrode is subjected to heat treatment at high temperature, the surface of the metal electrode is sometimes roughened though the atmosphere is not the oxidizing atmosphere. Thus, there arises a problem in that the leakage current is enlarged excessively.

SUMMARY OF THE INVENTION

The present invention was found to overcome the foregoing problems, and a first object of the present invention is to provide a semiconductor device, which can easily be manufactured.

A second object of the present invention is to provide a semiconductor device which has a cell capacitor having a good adhesion between an electrode and an interlayer insulating film.

A third object of the present invention is to provide a semiconductor having a decreased contact resistance and a large capacitance.

A fourth object of the present invention is to provide a semiconductor having a decreased leakage current.

To achieve the foregoing objects, according to a first aspect of the present invention, there is provided a semiconductor device comprising: a semiconductor substrate having a major surface; an interlayer insulating film formed on the major surface of the semiconductor substrate and having an opening formed to reach the major surface of the semiconductor substrate; a connection member disposed within the opening; a capacitor including a lower electrode of a capacitor electrically connected to the major surface of the semiconductor substrate through the connection member, a capacitor dielectric film formed on the lower electrode of the capacitor and made of a material having a large dielectric constant and an upper electrode of the capacitor formed on the capacitor dielectric film, wherein the lower electrode of the capacitor is a metal electrode, the metal electrode is mainly composed of ruthenium or iridium, and no oxide layer of materials of the metal electrode is formed on the surface of the metal electrode when the capacitor dielectric film is formed.

According to a second aspect of the present invention, there is provided a semiconductor device comprising: a semiconductor substrate having a major surface; an interlayer insulating film formed on the major surface of the semiconductor substrate and having an opening formed to reach the major surface of the semiconductor substrate; a connection member disposed within the opening; a capacitor including a lower electrode of a capacitor electrically connected to the major surface of the semiconductor substrate through the connection member, a capacitor dielectric film formed on the lower electrode of the capacitor and made of a material having a large dielectric constant and an upper electrode of the capacitor formed on the capacitor dielectric film, wherein the lower electrode of the capacitor consists of a contact layer and a metal electrode, the metal electrode is mainly composed of ruthenium or iridium, the contact layer is made of silicide of elements forming the metal electrode and held between the metal electrode and the connection member, and no oxide layer of materials of the metal electrode is formed on the surface of the metal electrode when the capacitor dielectric film is formed.

According to a third aspect of the present invention, there is provided a semiconductor device according to the first aspect or the second aspect of the present invention, wherein the top end of the connection member is made to be lower than the surface of the interlayer insulating film by 30 nm or more.

According to a fourth aspect of the present invention, there is provided a semiconductor device according to the first aspect or the second aspect of the present invention, wherein an adhesion layer is formed between the interlayer insulating film and the lower electrode of the capacitor.

According to a fifth aspect of the present invention, there is provided a semiconductor device according to the second aspect of the present invention, wherein an adhesion layer is formed between the interlayer insulating film and the lower electrode of the capacitor and the contact layer is composed of at least either of silicide of elements forming the adhesion layer or silicide of elements forming the lower electrode of the capacitor.

According to a sixth aspect of the present invention, there is provided a method of manufacturing a semiconductor device comprising the steps of: forming an interlayer insulating film on a major surface of a semiconductor substrate, the interlayer insulating film having an opening formed to reach the major surface; burying a connection member in the opening; forming a thin metal film made or mainly composed of ruthenium or iridium as the major component thereof, serving as a lower electrode of the capacitor to be electrically connected to the major surface of the semiconductor substrate through the connection member, and then processing the thin metal film into a predetermined lower electrode structure of the capacitor; and sequentially forming, on the metal electrode, a capacitor dielectric film, made of a material having a large dielectric constant, and an upper electrode of the capacitor in such a manner that no oxide layer of materials of the metal electrode is formed on the surface of the metal electrode.

According to a seventh aspect of the present invention, there is provided a method of manufacturing a semiconductor device comprising the steps of: forming an interlayer insulating film on a major surface of a semiconductor substrate, the interlayer insulating film having an opening formed to reach the major surface; burying a connection member containing silicon as the major component thereof in the opening; forming a thin metal film made or mainly composed of ruthenium or iridium, serving as a lower electrode of the capacitor to be electrically connected to the major surface of the semiconductor substrate through the connection member, and then processing the thin metal film into a predetermined lower electrode structure of the capacitor; performing heat treatment in such a manner that a silicide layer of the thin metal film is formed between the metal electrode and the connection member; and sequentially forming, on the metal electrode, a capacitor dielectric film, made of a material having a large dielectric constant, and an upper electrode of the capacitor in such a manner that no oxide layer of materials of the metal electrode is formed on the surface of the metal electrode.

According to an eighth aspect of the present invention, there is provided a method of manufacturing a semiconductor device comprising the steps of: forming an interlayer insulating film on a major surface of a semiconductor substrate, the interlayer insulating film having an opening formed to reach the major surface; burying a connection member in a portion of the opening; forming a thin metal film made or mainly composed of ruthenium or iridium as the major component thereof, serving as a lower electrode of the capacitor to be electrically connected to the major surface of the semiconductor substrate through the connection member so as to cover the interlayer insulating film and plug the opening, and then processing the thin metal film into a predetermined lower electrode structure of the capacitor; and sequentially forming, on the metal electrode, a capacitor dielectric film, made of a material having a large dielectric constant, and an upper electrode of the capacitor in such a manner that no oxide layer of materials of the metal electrode is formed on the surface of the metal electrode.

According to a ninth aspect of the present invention, there is provided a method of manufacturing a semiconductor device comprising the steps of: forming an interlayer insulating film on a major surface of a semiconductor substrate, the interlayer insulating film having an opening formed to reach the major surface; burying a connection member containing silicon as the major component thereof in a portion of the opening; forming a thin metal film made or mainly composed of ruthenium or iridium, serving as a lower electrode of the capacitor to be electrically connected to the major surface of the semiconductor substrate through the connection member so as to cover the interlayer insulating film and plug the opening, and then processing the thin metal film into a predetermined lower electrode structure of the capacitor; performing heat treatment in such a manner that a silicide layer of the thin metal film is formed between the metal electrode and the connection member; and sequentially forming, on the metal electrode, a capacitor dielectric film, made of a material having a large dielectric constant, and an upper electrode of the capacitor in such a manner that no oxide layer of materials of the metal electrode is formed on the surface of the metal electrode.

According to a tenth aspect of the present invention, there is provided a method of manufacturing a semiconductor device according to any one of the sixth to ninth aspects of the present invention and further comprising the step of flattening the surface of the lower electrode of the capacitor by a chemical and mechanical grinding method, the step being performed after the step of forming the lower electrode of the capacitor has been performed.

According to an eleventh aspect of the present invention, there is provided a method of manufacturing a semiconductor device according to any one of the sixth to tenth aspects of the present invention and further comprising the step of forming an adhesion layer between the interlayer insulating film and the lower electrode of the capacitor, the step being performed after the step of burying the connection member in the opening of the interlayer insulating film has been performed.

The semiconductor device according to the first aspect of the present invention includes the lower electrode of the capacitor which is the metal electrode, the metal electrode contains ruthenium or iridium as the major component thereof, and the surface of the metal electrode is not oxidized when the capacitor dielectric film is formed. Since the lower electrode of the capacitor is the metal electrode made of iridium or ruthenium, the electrode can easily be processed as compared with the conventional case where platinum is employed to form the electrode. Since the electrode is not oxidized when the capacitor dielectric film is formed, the structure of the cell can be simplified. Since iridium and ruthenium are chemically stable when the capacitor dielectric film is formed, reduction in the capacitance can be prevented. In the case where high temperature heat treatment is performed after the metal electrode has been formed, which is made of iridium or ruthenium, the surface of the metal electrode of sometimes roughened and, thus, the leakage current is sometimes enlarged though the atmosphere is not an oxidizing atmosphere. However, the chemical and mechanical grinding method for flattening the surface will prevent enlargement of the leakage current. When the structure of the capacitor is formed into a stereoscopic cell structure, such as a stacked-type structure and the lower electrode of the capacitor is made of ruthenium or iridium, the capacity of the capacitor can be enlarged.

The semiconductor device according to the second aspect of the present invention enables advantages similar to those obtainable from the semiconductor device according to the first aspect of the present invention to be realized. Since the contact layer made of silicide of elements forming the metal electrode is formed between the metal electrode and the connection member, the contact resistance can be reduced.

The semiconductor device according to the third aspect of the present invention enables advantages similar to those obtainable from the semiconductor device according to the first aspect or the second aspect of the present invention to be realized. Since the top end of the connection member is made to be lower than the surface of the interlayer insulating film, oxidation of the connection member taking place when the capacitor dielectric film is formed can be prevented.

The semiconductor device according to the fourth aspect of the present invention enables advantages similar to those obtainable from the semiconductor device according to the first aspect or the second aspect of the present invention to be realized. Since the adhesion layer is formed between the interlayer insulating film and the lower electrode of the capacitor, the adherence between the interlayer insulating film and the lower electrode of the capacitor can be improved.

The semiconductor device according to the fifth aspect of the present invention enables advantages similar to those obtainable from the semiconductor device according to the second aspect of the present invention to be realized. Since the adhesion layer is formed between the interlayer insulating film and the lower electrode of the capacitor, the adherence between the interlayer insulating film and the lower electrode of the capacitor can be improved. Since the contact layer is made of the silicide of the elements forming the adhesion layer or the silicide of elements forming the lower electrode of the capacitor, the contact resistance can further be reduced.

The method of manufacturing the semiconductor device according to the sixth aspect of the present invention is different from the conventional manufacturing method in that the lower electrode of the capacitor is the metal electrode, the major component element of which is ruthenium or iridium, and the capacitor dielectric film, made of the material having a large dielectric constant, and the upper electrode of the capacitor are formed on the metal electrode in such a manner that no oxide layer of the materials of the metal electrode is formed on the surface of the metal electrode. Therefore, the semiconductor device having the variety of advantages can easily be manufactured.

The method of manufacturing the semiconductor device according to the seventh aspect of the present invention is different from the conventional manufacturing method in that the lower electrode of the capacitor is the metal electrode, the major component element of which is ruthenium or iridium, the silicide layer is formed between the metal electrode and the connection member, and the capacitor dielectric film, made of the material having a large dielectric constant, and the upper electrode of the capacitor are formed on the metal electrode in such a manner that no oxide layer of the materials of the metal electrode is formed on the surface of the metal electrode. Therefore, the semiconductor device having the variety of advantages can easily be manufactured.

The method of manufacturing the semiconductor device according to the eighth aspect of the present invention is different from the conventional manufacturing method in that the lower electrode of the capacitor is the metal electrode, the major component element of which is ruthenium or iridium, and the capacitor dielectric film, made of the material having a large dielectric constant, and the upper electrode of the capacitor are formed on the metal electrode in such a manner that no oxide layer of the materials of the metal electrode is formed on the surface of the metal electrode. Therefore, the semiconductor device having the variety of advantages can easily be manufactured. Since the connection member is buried in only a portion of the opening, the top end of the connection member is made to be lower than the surface of the interlayer insulating film. Thus, oxidation of the connection member can be prevented when the capacitor dielectric film is formed.

The method of manufacturing the semiconductor device according to the ninth aspect of the present invention is different from the conventional manufacturing method in that the lower electrode of the capacitor is the metal electrode, the major component element of which is ruthenium or iridium, the silicide layer is formed between the metal electrode and the connection member, and the capacitor dielectric film, made of the material having a large dielectric constant, and the upper electrode of the capacitor are formed on the metal electrode in such a manner that no oxide layer of the materials of the metal electrode is formed on the surface of the metal electrode. Therefore, the semiconductor device having the variety of advantages can easily be manufactured. Since the connection member containing silicon as the major component is buried in only a portion of the opening, the top end of the connection member is made to be lower than the surface of the interlayer insulating film. Thus, oxidation of the connection member can be prevented when the capacitor dielectric film is formed.

The method of manufacturing the semiconductor device according to the tenth aspect of the present invention enables the advantages similar to those obtainable from the method of manufacturing the semiconductor device according to any one of the sixth to ninth aspects of the present invention to be realized. Since the surface of the lower electrode of the capacitor can be flattened by the chemical and mechanical grinding method after the lower electrode of the capacitor has been formed, enlargement of the leakage current can be prevented.

The method of manufacturing the semiconductor device according to the eleventh aspect of the present invention enables advantages similar to those obtainable from the method of manufacturing the semiconductor device according to any of the sixth to tenth aspects of the present invention to be realized. Since the adhesion layer is formed between the interlayer insulating film and the lower electrode of the capacitor, the adherence between the interlayer insulating film and the lower electrode of the capacitor can be improved.

Other objects, features and advantages of the invention will be evident from the following detailed description of the preferred embodiments described in conjunction with the attached drawings.

DETAILED DESCRIPTION OF THE PREFERRED EMBODIMENTS

Preferred embodiments of the present invention will now be described.

First Embodiment

Figure 1:
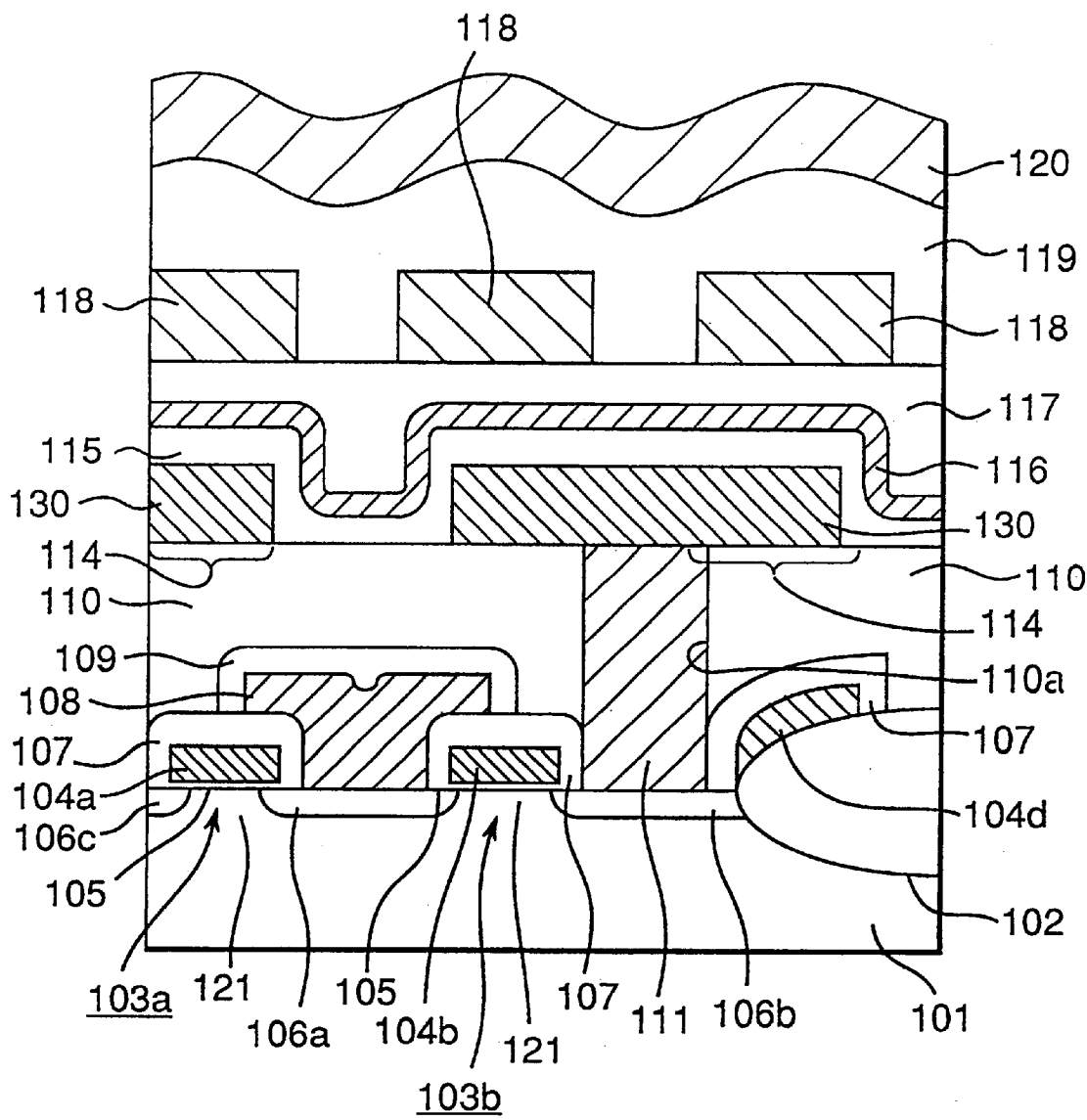
FIG. 1 is a partial cross sectional view showing a DRAM according to a first embodiment of the present invention.
Figure 22:
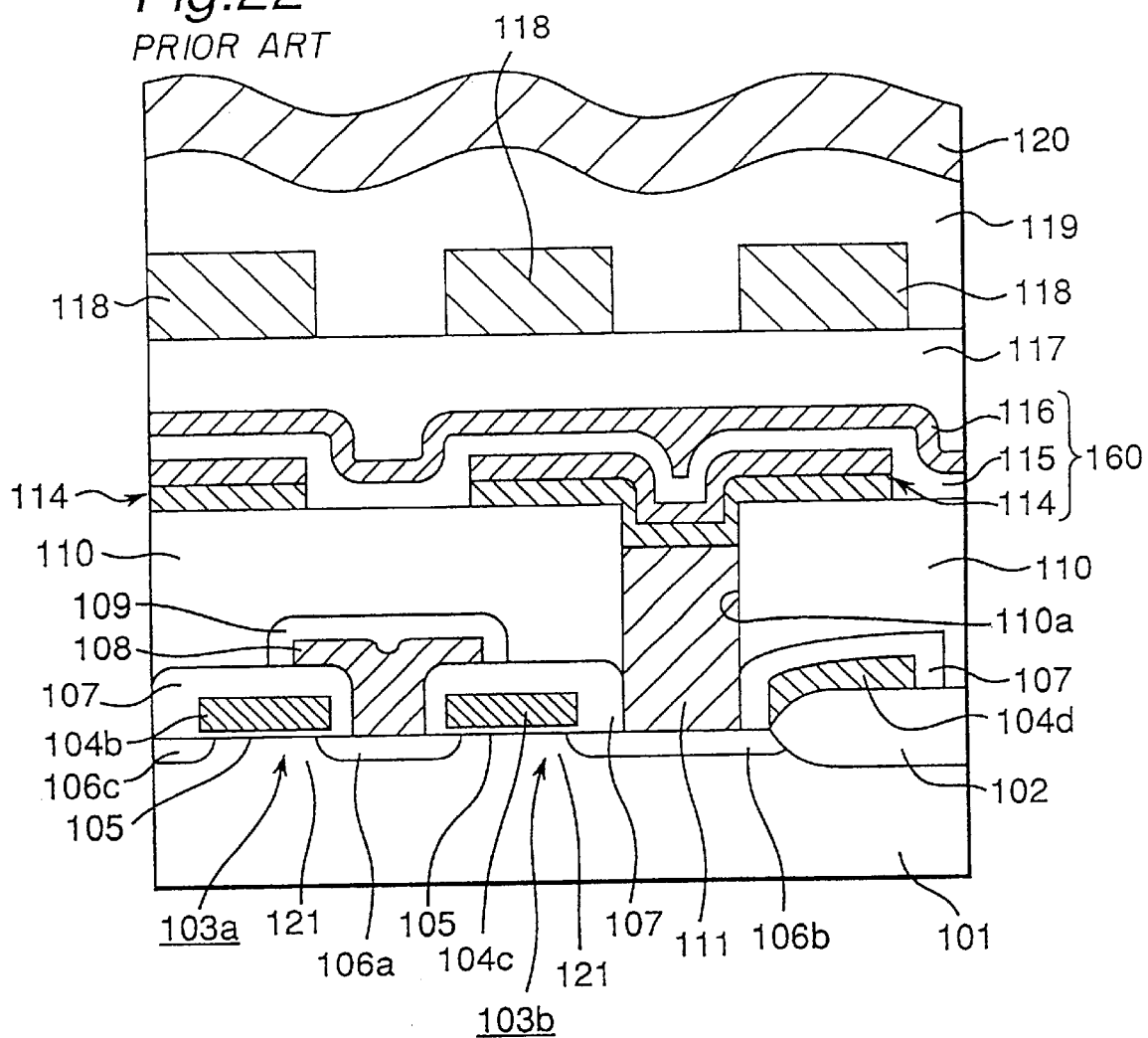
FIG. 22 is a partial cross sectional view showing an example of a conventional DRAM.
Figure 7:
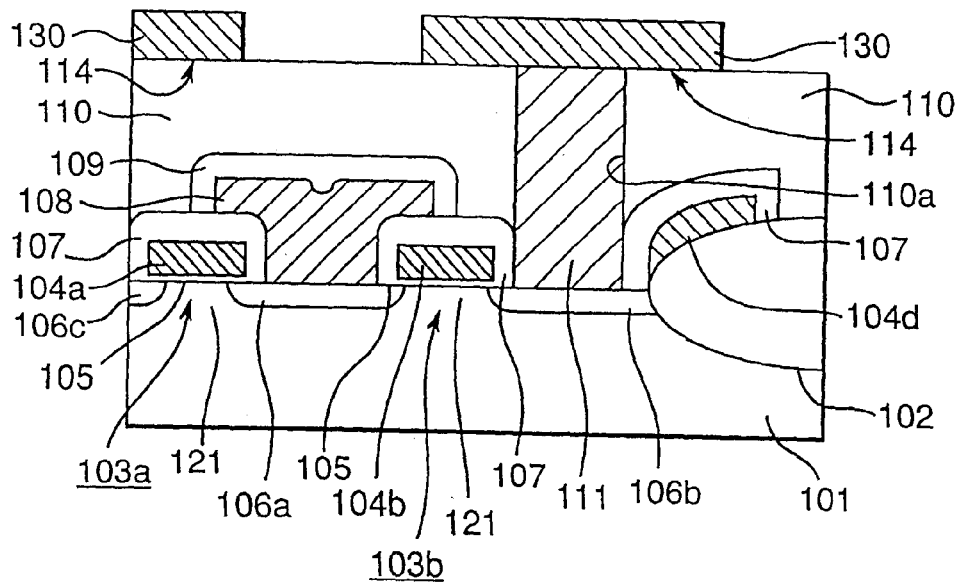
Figure 8:
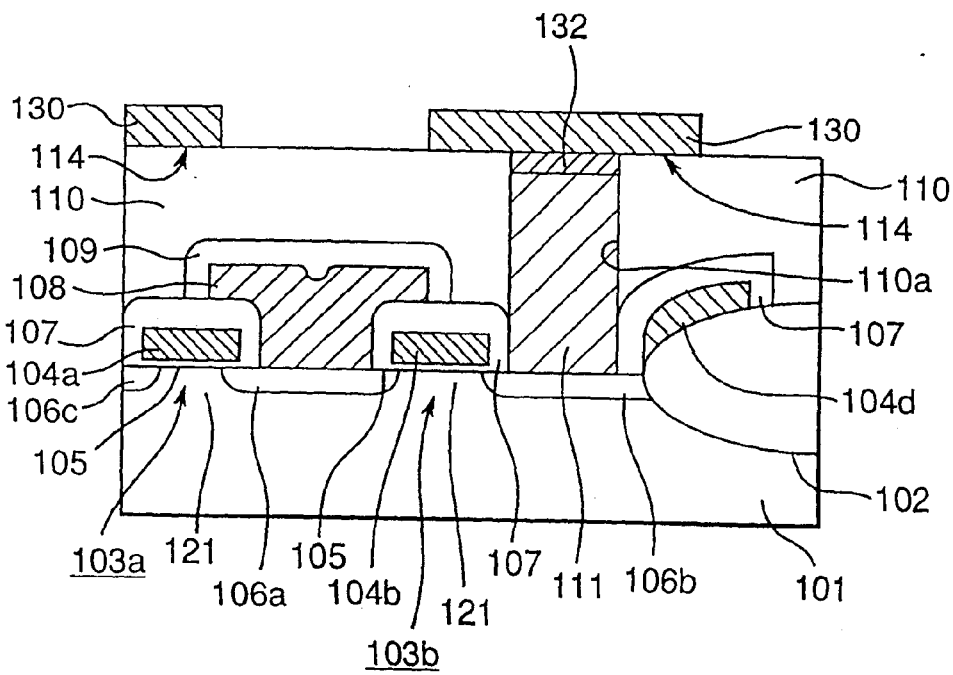
Figure 9:
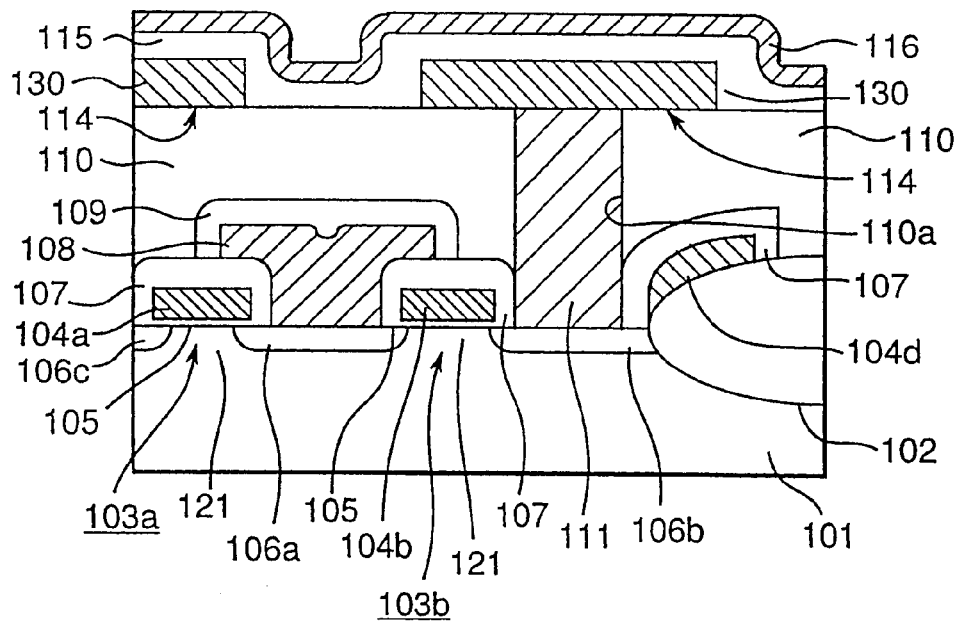
Figure 10:
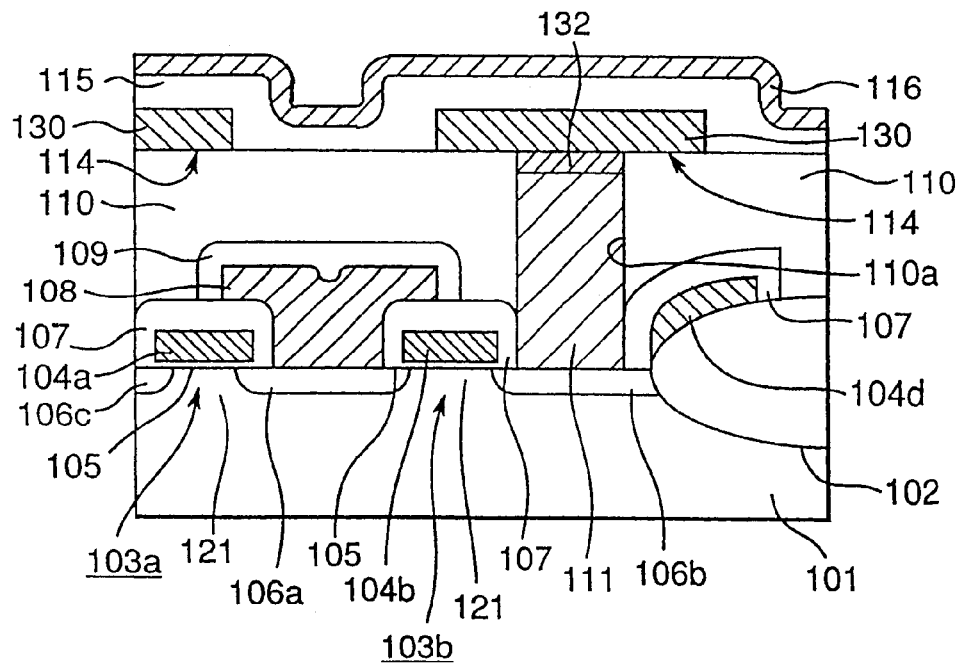
Figure 12:
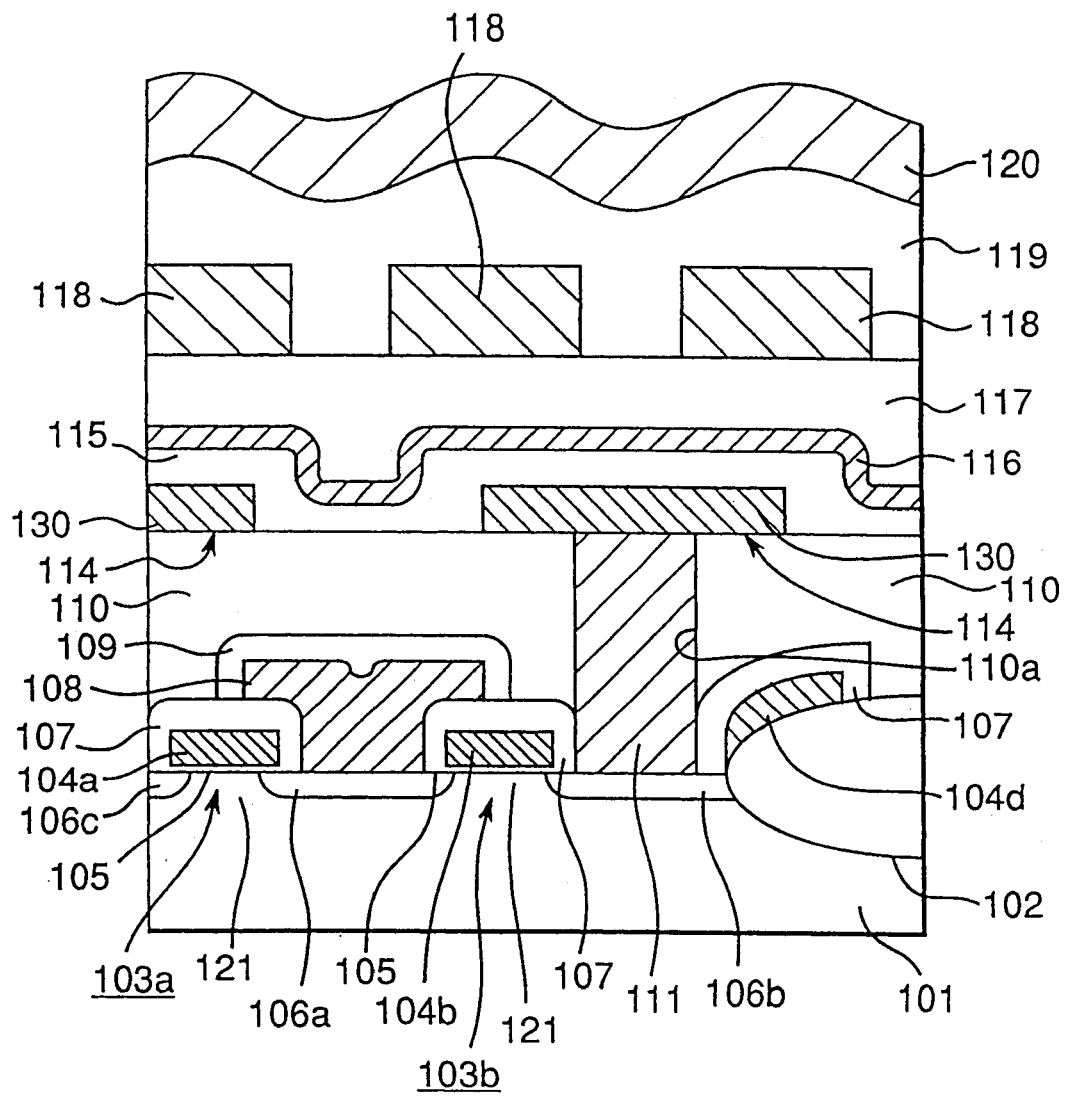

A first embodiment of the present invention will now be described with reference to FIG. 1. FIG. 1 is a partial cross sectional view showing the structure of a DRAM according to a first embodiment of the present invention. Referring to FIG. 1, the structure of the lower portion of the capacitor is the same as that of the conventional semiconductor device, an example of which is shown in FIG. 22, the lower structure consisting of the P-type semiconductor substrate 101, the field oxide film 102, the transfer gate transistors 103a and 103b, the N-type impurity regions 106a, 106b and 106c, the channel regions 121, the gate insulating film 105, the gate electrodes 104a, 104b and 104d, the oxide film 107, the buried bit line 108, the insulating layer 109, the first interlayer insulating film 110, the contact hole 110a and the plug 111. Moreover, the structure of the upper portion of the capacitor, consisting of the second interlayer insulating film 117, the first aluminum line layer 118, the protective film 119 and the aluminum line layer 120, etc., is the same as that of the conventional semiconductor device shown in FIG. 22.

Figure 2:
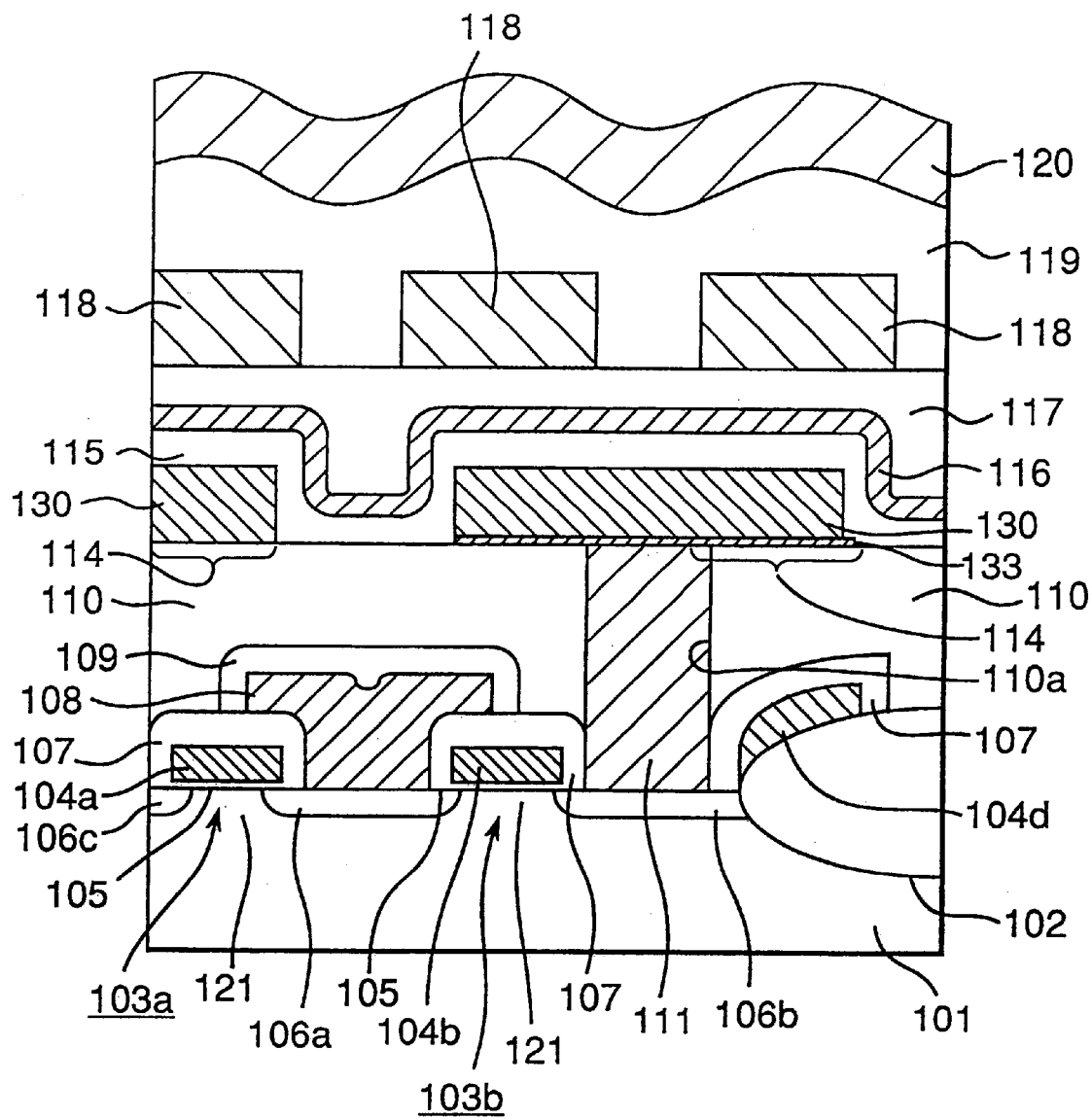
FIG. 2 is another partial cross sectional view showing the DRAM according to the first embodiment of the present invention.

The first embodiment had a structure such that the lower electrode 114 of the capacitor was a metal electrode 130. As the material of the metal electrode 130, ruthenium or iridium was employed in place of platinum, which was the conventional material. It is preferable that the film thickness of the metal electrode 130 be 30 nm to 600 nm. In the first embodiment, the thickness of the metal electrode 130 was determined to be 300 nm. In the case where the adherence between the interlayer insulating film 110 and the metal electrode 130 is unsatisfactory, it was effective to form an adhesion layer 133 by metal, such as titanium, zirconium, tantalum, silicon, chrome, nickel, cobalt, niobium or molybdenum, or their alloys or their nitrides, as shown in FIG. 2. The capacitor dielectric film 115 was made of $BaTiO_3$ film. In the first embodiment, the CVD method was employed to form the capacitor dielectric film 115 in view of improving the characteristic covering the side surfaces of the lower electrode. Since the capacitor dielectric film 115 was formed under condition that the temperature of the substrate was 500° C. and the partial pressure of oxygen was 1 torr, the surface of the metal electrode 130 was not oxidized. Since oxidation of the surface of the metal electrode 130 was prevented, enlargement of the leakage current taking place due to roughening of the surface of the metal electrode 130 was prevented. A fact was confirmed that oxidation of the surface of the metal electrode 130 was prevented if the temperature of the substrate was 550° C. or lower or the partial pressure of oxygen was 15 torr or lower. The electrode film and the capacitor dielectric film were etched by a reactive ion etching method. Since the electrode of the capacitor was, in this embodiment, made of ruthenium or iridium in place of the conventional material, that is, platinum, the reactive ion etching process was facilitated. The upper electrode 116 of the capacitor was made of ruthenium. It is preferable that the film thickness of the upper electrode 116 of the capacitor be 30 nm to 600 nm. In this embodiment, the film thickness was determined to be 100 nm. No generation of a layer having a low dielectric constant took place in the interface when the capacitor dielectric film was formed. Thus, a reliable capacitor characteristic was realized.

Since oxidation of the surface of the electrode was prevented when the capacitor dielectric film was formed, the structure of the cell was simplified and stable capacitor characteristic was managed to be obtained. The adherence between the interlayer insulating film and the metal electrode was improved thanks to the adhesion layer. Since the lower electrode of the capacitor was the metal electrode made of iridium or ruthenium, the electrode was easily processed as compared with the conventional case where platinum was employed to form the electrode. As a matter of course, the present invention may effectively be adapted to a device except the DRAM, such as a device having a thin-film capacitor formed by a film having a large dielectric constant.

Second Embodiment

Figure 3:
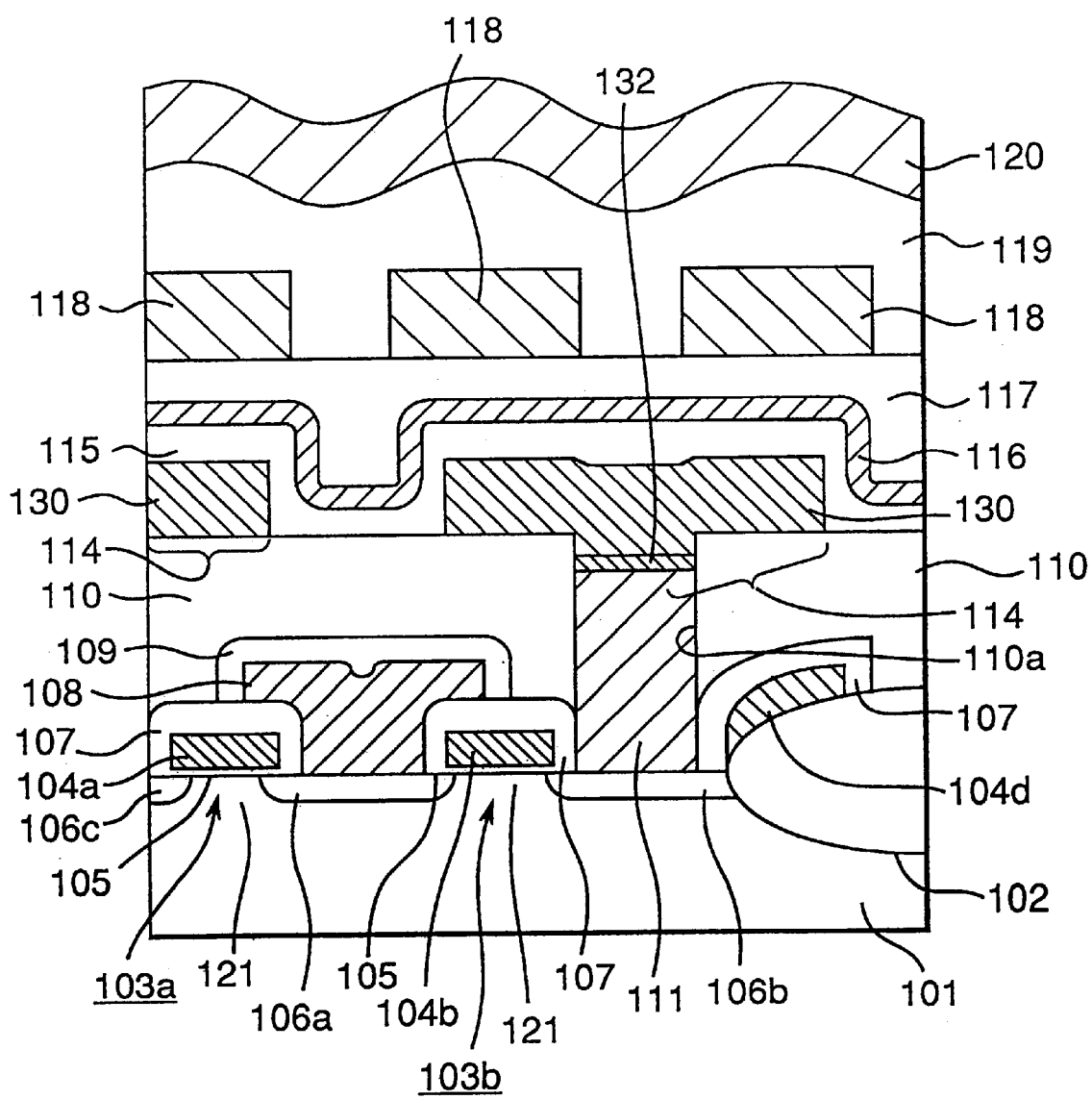
FIG. 3 is a partial cross sectional view showing a DRAM according to a second embodiment of the present invention.

A second embodiment of the present invention will now be described with reference to FIG. 3. FIG. 3 is a partial cross sectional view showing the structure of a DRAM according to a second embodiment of the present invention. Referring to FIG. 3, the structure of the lower portion of the capacitor is the same as that of the conventional semiconductor device, an example of which is shown in FIG. 22, the lower structure consisting of the P-type semiconductor substrate 101, the field oxide film 102, the transfer gate transistors 103a and 103b, the N-type impurity regions 106a, 106b and 106c, the channel regions 121, the gate insulating film 105, the gate electrodes 104a, 104b and 104d, the oxide film 107, the buried bit line 108, the insulating layer 109, the first interlayer insulating film 110, the contact hole 110a and the plug 111, etc. Moreover, the structure of the upper portion of the capacitor, consisting of the second interlayer insulating film 117, the first aluminum line layer 118, the protective film 119 and the aluminum line layer 120, etc., is the same as the conventional semiconductor device shown in FIG. 22.

Figure 4:
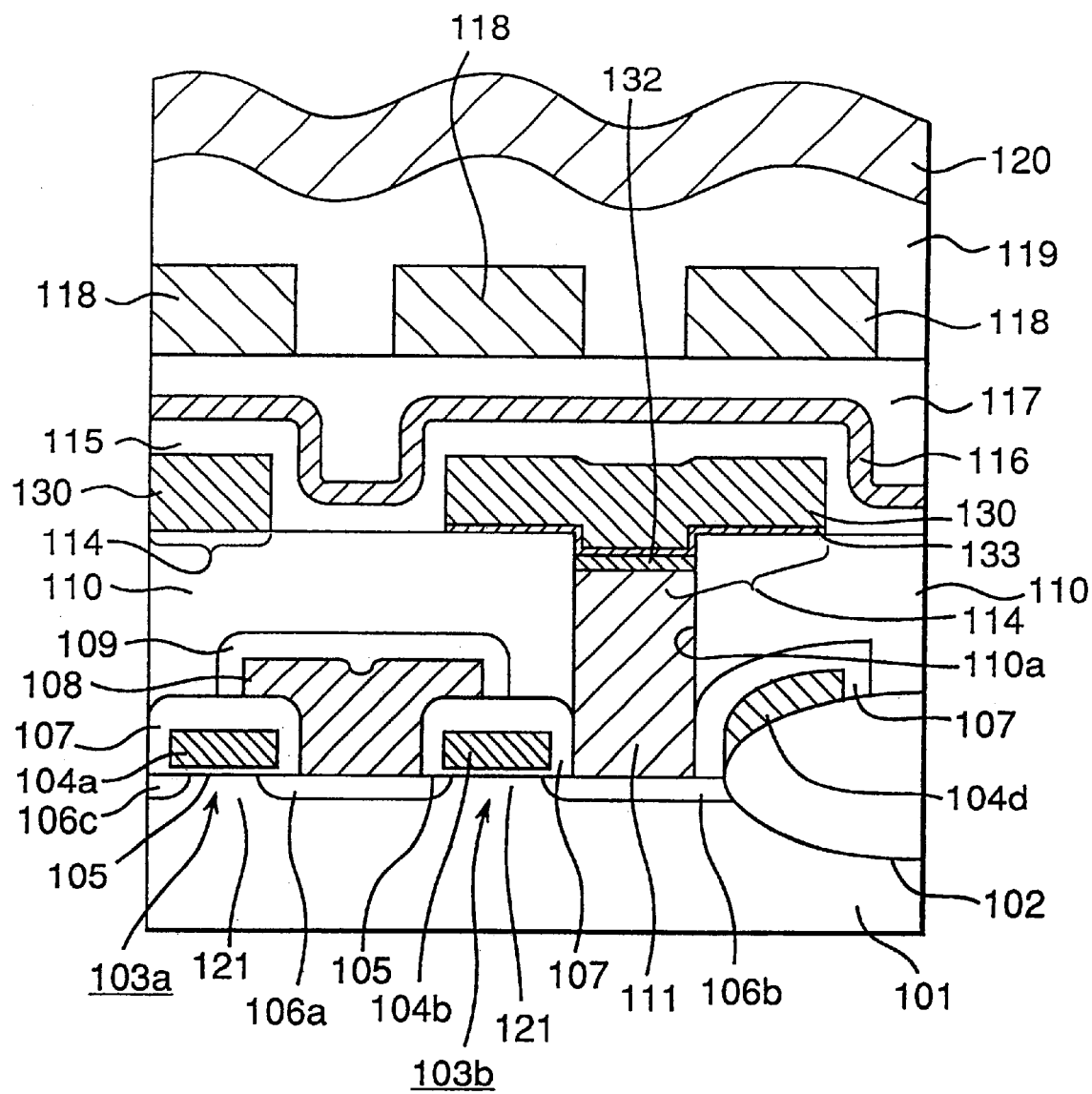
FIG. 4 is another partial cross sectional view showing the DRAM according to the second embodiment of the present invention.

In the second embodiment, the plug 111 was made of polycrystal silicon containing doped phosphorus. To prevent oxidation of the plug 111 when the capacitor dielectric film 115 was formed, the polycrystal silicon was etched so that the top end of the plug 111 was made to be lower than the top surface of the first interlayer insulating film 110. The preferred extent of lowering is 30 nm to 500 nm. In the second embodiment, it was determined to be 50 nm. A silicide layer 132 and the metal electrode 130 were formed to cover the plug 111 so as to serve as the lower electrode 114 of the capacitor. The material of the metal electrode 130 was ruthenium or iridium in place of platinum, which was the conventional material. By performing heat treatment at 600 ° C. or higher, a portion of the metal electrode 130 reacts with silicon in the plug 111 so as to be formed into the silicide layer 132. Since the silicide layer 132 is formed, the electrical resistance between the lower electrode 114 of the capacitor and the semiconductor substrate 101 can be reduced. In a case where the adhesion layer 133 according to the first embodiment is formed between the interlayer insulating film 110 and the metal electrode 130 as shown in FIG. 4, a silicide layer is sometimes formed due to reaction between the adhesion layer 133 and silicon in the plug 111. Note that a fact was confirmed that the formed silicide layer did not raise a problem and the electrical resistance between the lower electrode 114 of the capacitor and the substrate 101 was managed to be reduced. It is preferable that the film thickness of the metal electrode 130 serving as the lower electrode of the capacitor be 30 nm to 200 nm. It was determined to be 100 nm in the second embodiment. The upper electrode 116 of the capacitor was made of ruthenium. It is preferable that the film thickness of the upper electrode 116 of the capacitor be 40 nm to 500 nm. In the second embodiment, the thickness was determined to be 100 nm. The capacitor dielectric film 115 was made of $SrTiO_3$. In the second embodiment, the CVD method was employed to form the capacitor dielectric film 115 in view of improving the characteristic covering the side surfaces of the lower electrode, similarly to the first embodiment. Since the capacitor dielectric film 115 was formed under condition that the temperature of the substrate was 500° C. and the partial pressure of oxygen was 1 torr, the surface of the metal electrode 130 was not oxidized. Since oxidation of the surface of the metal electrode 130 was prevented, enlargement of the leakage current taking place due to roughening of the surface of the metal electrode 130 was prevented. A fact was confirmed that oxidation of the surface of the metal electrode 130 was prevented if the temperature of the substrate was 550° C. or lower or the partial pressure of oxygen was 15 torr or lower. The electrode film and the capacitor dielectric film were etched by a reactive ion etching method. Since the electrode of the capacitor was, in the second embodiment, made of ruthenium or iridium in place of the conventional material, that is, platinum, the reactive ion etching process was facilitated. Moreover, no generation of a layer having a low dielectric constant took place when the capacitor dielectric film was formed. Thus, a reliable capacitor characteristic was realized. Since the device according to this embodiment has the structure such that the top end of the plug was made to be lower than the top surface of the interlayer insulating film and a portion of the lower electrode was formed into the silicide layer, the contact resistance was managed to be reduced. Another fact was confirmed that the effect of reducing the contact resistance was managed to be obtained by forming a portion of the lower electrode into a silicide layer in place of making the top end of the plug to be lower than the top surface of the interlayer insulating film.

Since oxidation of the surface of the electrode was prevented when the capacitor dielectric film was formed, the structure of the cell was simplified. Since the lower electrode of the capacitor was the metal electrode, made of iridium or ruthenium, and the silicide layer made of iridium or ruthenium, the electrode was processed easily as compared with the conventional case where platinum was employed as the material of the electrode. The adherence between the interlayer insulating film and the metal electrode was managed to be improved thanks to the adhesion layer. Since silicon in the plug and the metal electrode were connected to each other through the silicide layer, the contact resistance was reduced. Since the top end of the plug was made to be lower than the top surface of the interlayer insulating film, oxidation of silicon in the plug was prevented when the capacitor dielectric film was formed. As a matter of course, the present invention may effectively be adapted to a device except the DRAM, such as a device having a thin-film capacitor formed by a film having a large dielectric constant.

Third Embodiment a method of manufacturing a semiconductor device according to a third embodiment of the present invention will now be described with reference to FIGS. 5 to 12. FIGS. 5 to 12 are partial cross sectional views showing a process for manufacturing (a method of manufacturing) a DRAM according to the third embodiment of the present invention.

Figure 5:
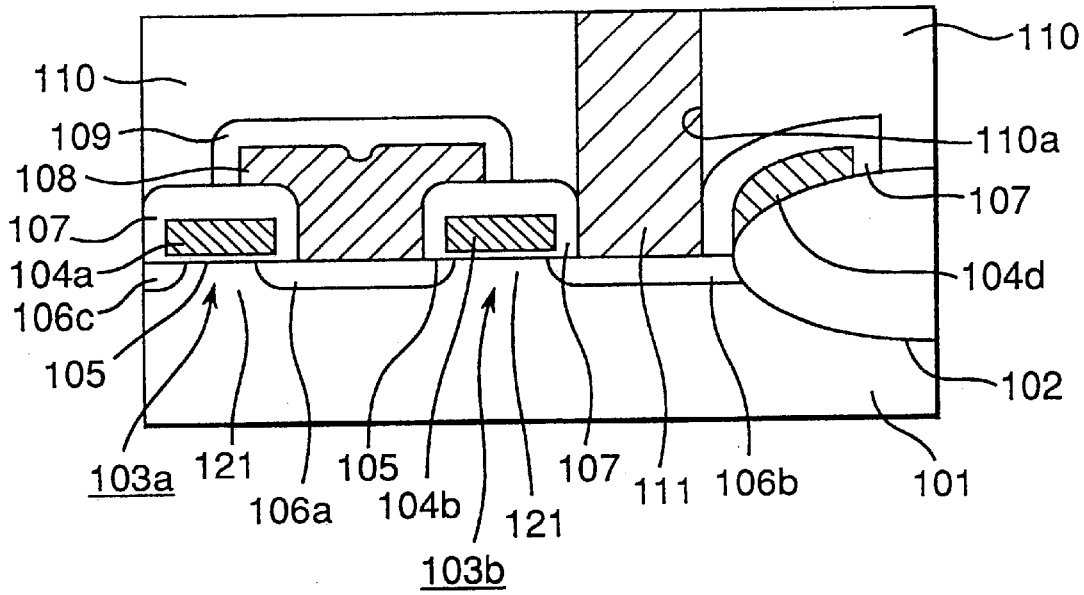
FIG. 5 is a partial cross sectional view showing a first step of a method of manufacturing a DRAM according to a third embodiment of the present invention.

Initially, a method similar to the conventional method is employed as shown in FIG. 5 so that the structure of the lower portion of the capacitor was formed which consists of the P-type semiconductor substrate 101, the field oxide film 102, the transfer gate transistors 103a and 103b, the N-type impurity regions 106a, 106b and 106c, the channel regions 121, the gate insulating film 105, the gate electrodes 104a, 104b and 104d, the oxide film 107, the buried bit line 108, the insulating layer 109, the first interlayer insulating film 110 and the contact hole 110a. A CVD method using $SiH_4$ gas is employed to plug the contact hole 110a and a polycrystal silicon layer formed to cover the first interlayer insulating film 110 and containing doped phosphorus is etched back by a RIE method or the like. As a result, the plug 111 is formed in the contact hole 110a. Although the material of the plug 111 according to the third embodiment was silicon, metal, such as tungsten, titanium or tantalum, or their alloys or their nitrides may be employed.

Figure 6:
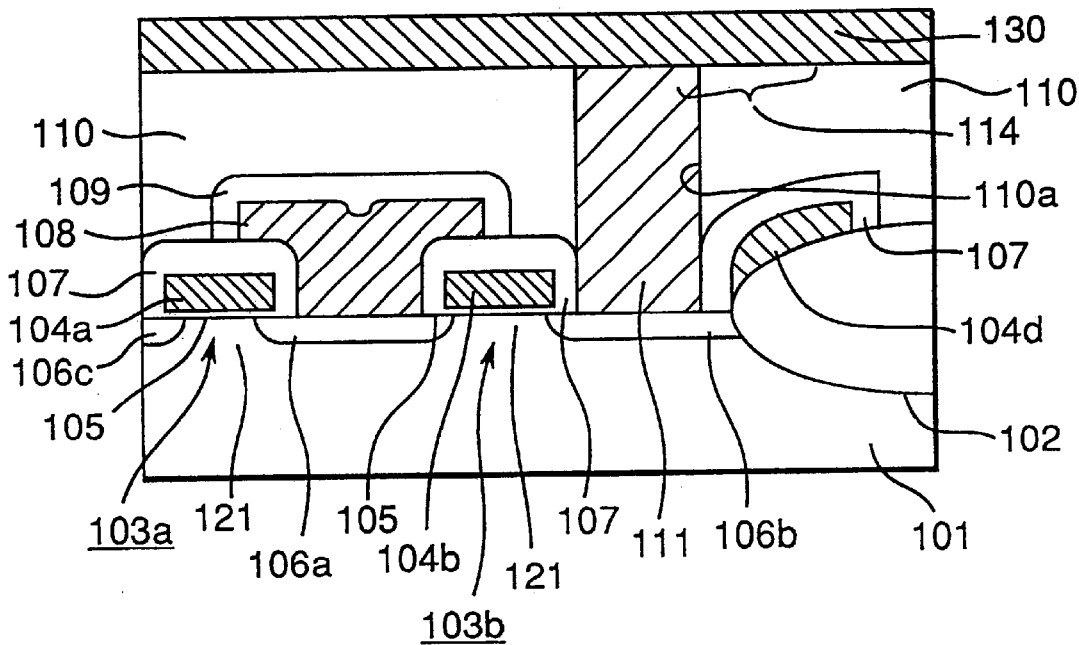
FIG. 6 is a partial cross sectional view showing a second step of the method of manufacturing the DRAM according to the third embodiment of the present invention.

Then, the metal electrode 130 is, as shown in FIG. 6, deposited on the top surface of the plug 111 and the surface of the first interlayer insulating film 110. As the material of the metal electrode 130, ruthenium or iridium is employed. In a case where the adherence between the metal electrode 130 and the first interlayer insulating film 110 is unsatisfactory, the method according to the first embodiment in which the adhesion layer 133 is formed may effectively be employed through the method was not employed in the third embodiment. Ruthenium or iridium can be deposited by the CVD method or the sputtering method. In the third embodiment, a ruthenium film to serve as the metal electrode 130 was formed by the sputtering method to have a thickness of 300 nm after the semiconductor substrate 101 was heated to 400° C. Although heating of the semiconductor substrate 101 may be omitted, it is preferable that the temperature be 850° C. or lower if heating is performed. It is preferable that the film thickness of the metal electrode 130 be in a range from 20 nm to 500 nm. The metal electrode 130 may be formed by the CVD method. In the case where ruthenium is deposited by the CVD method, the raw material may be any one of Ru $(C5H5)_2$, RU $(DPM)_3$, $RU_3$ $(CO)_{12}$ or Ru (hfb) $(CO)_4$ and deposition may be performed at 300° C. to 700° C.

In a case where ruthenium to form the metal electrode 130 is subjected to heat treatment at temperatures higher than the temperature at which the ruthenium film is formed, the surface of the ruthenium film is sometimes roughened and the leakage current is sometimes enlarged. In this case, a chemical and mechanical grinding method may be employed to flatten the surface, as shown in FIG. 6. If the process for flatting the surface by the chemical and mechanical grinding method is not performed, a large leakage current of 10 mA or more per square centimeter was generated. When the surface was flattened by the foregoing method, a leakage current of 45 nA per square centimeter resulted when voltage of 1 V was applied. Thus, no enlargement of the leakage current was confirmed as compared with 45 nA per square centimeter realized in a case where a flat metal film electrode was deposited.

Figure 7:
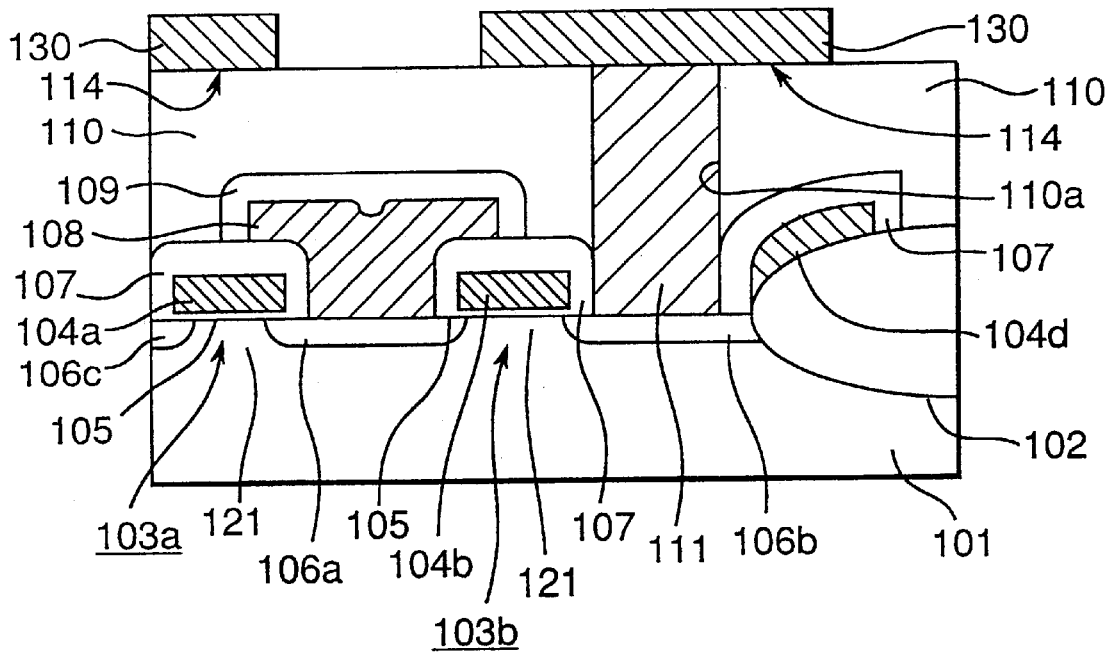
FIG. 7 is a partial cross sectional view showing a third step of the method of manufacturing the DRAM according to the third embodiment of the present invention.

Then, as shown in FIG. 7, the metal electrode 130 was subjected to the RIE process so that the metal electrode 130 was patterned to have a predetermined shape. In the third embodiment, since the electrode of the capacitor was made of ruthenium or iridium in place of platinum, which was the conventional material, the RIE process was performed easily. Moreover, no residue was observed on the side surfaces of the metal electrode 130.

Figure 8:
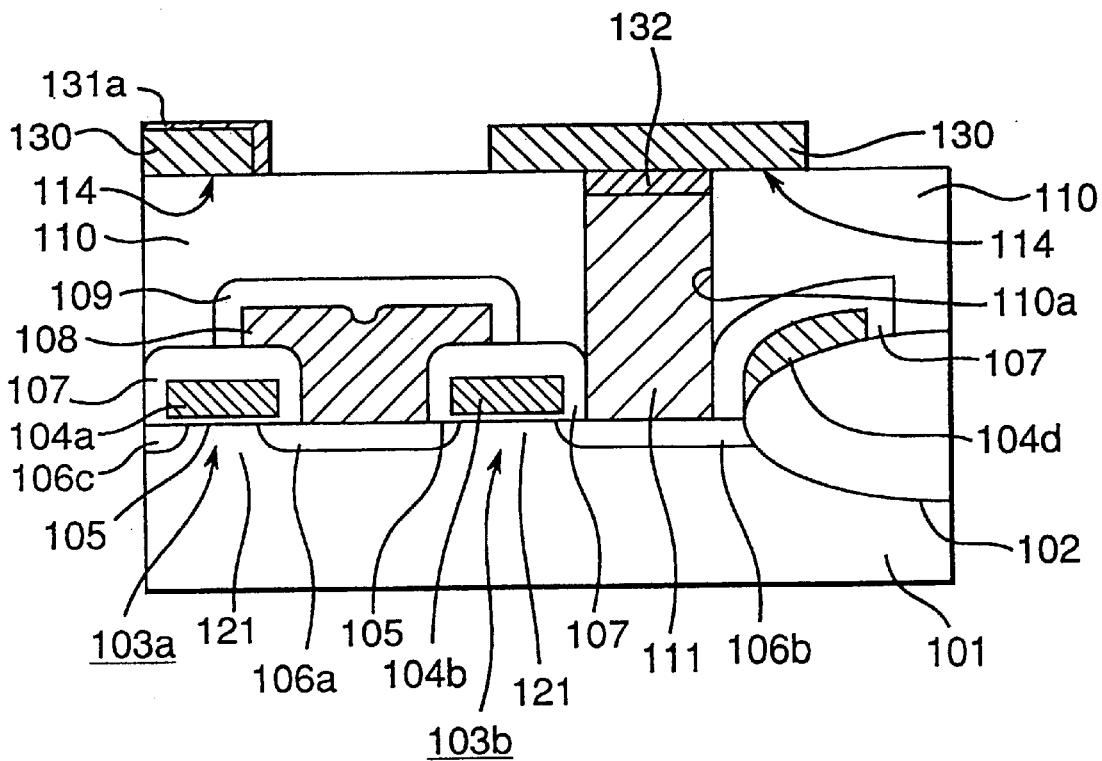
FIG. 8 is a partial cross sectional view showing a third step of another method of manufacturing the DRAM according to the third embodiment of the present invention.

In the case where the material, the major component of which is silicon, is selected to form the plug 111 as is employed in the third embodiment, as shown in FIG. 8, a quick heat treatment is performed at 500° C. to 800° C. for 10 seconds to 60 seconds so that a portion of the metal electrode 130 is formed into metal silicide. In the third embodiment, a ruthenium silicide layer 132 having a film thickness of 10 nm was formed. It is preferable that the silicide layer 132 be 50 nm or thinner. By forming a portion of the metal electrode 130 into the silicide layer, a further stable contact can be formed and the contact resistance can be reduced. As has been suggested in the first embodiment, in a case where the adhesion layer is formed between the first interlayer insulating film 110 and the metal electrode 130, a silicide layer is sometimes formed due to reaction between the adhesion layer and silicon in the plug 111. Note that a fact was confirmed that the formed silicide layer did not raise a problem and the electrical resistance between the lower electrode 114 of the capacitor and the substrate 101 was managed to be reduced. Although the silicide layer is, in the third embodiment, formed after the metal electrode has been processed, the silicide layer may be formed before the metal electrode is processed.

Figure 9:
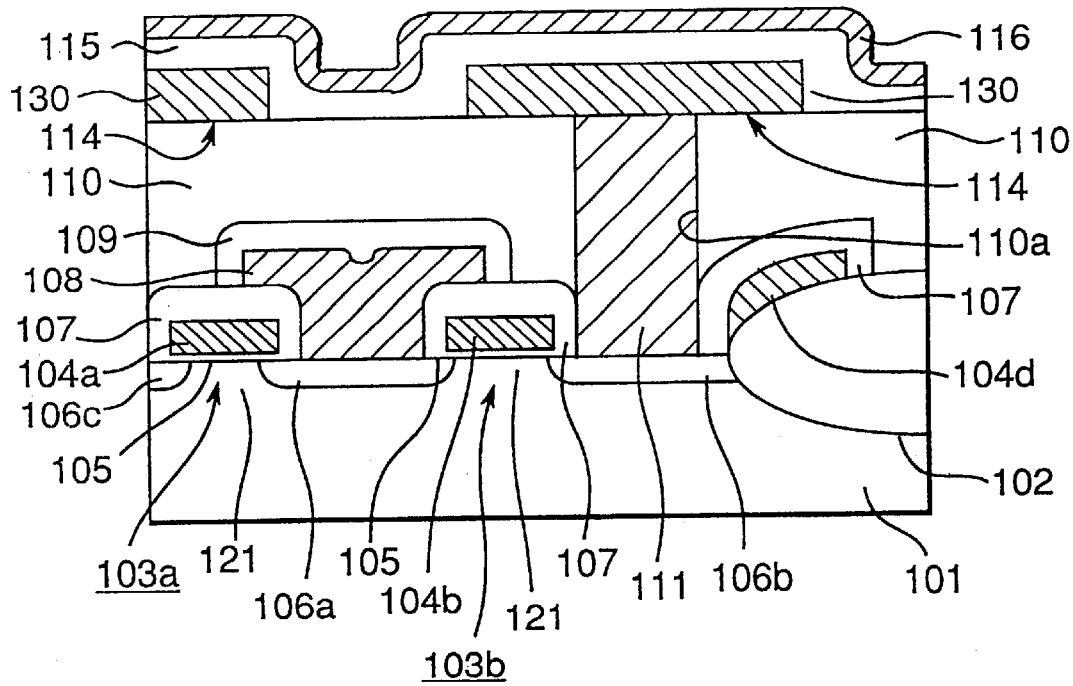
FIG. 9 is a partial cross sectional view showing a fourth step of the method of manufacturing the DRAM according to the third embodiment of the present invention.
Figure 10:
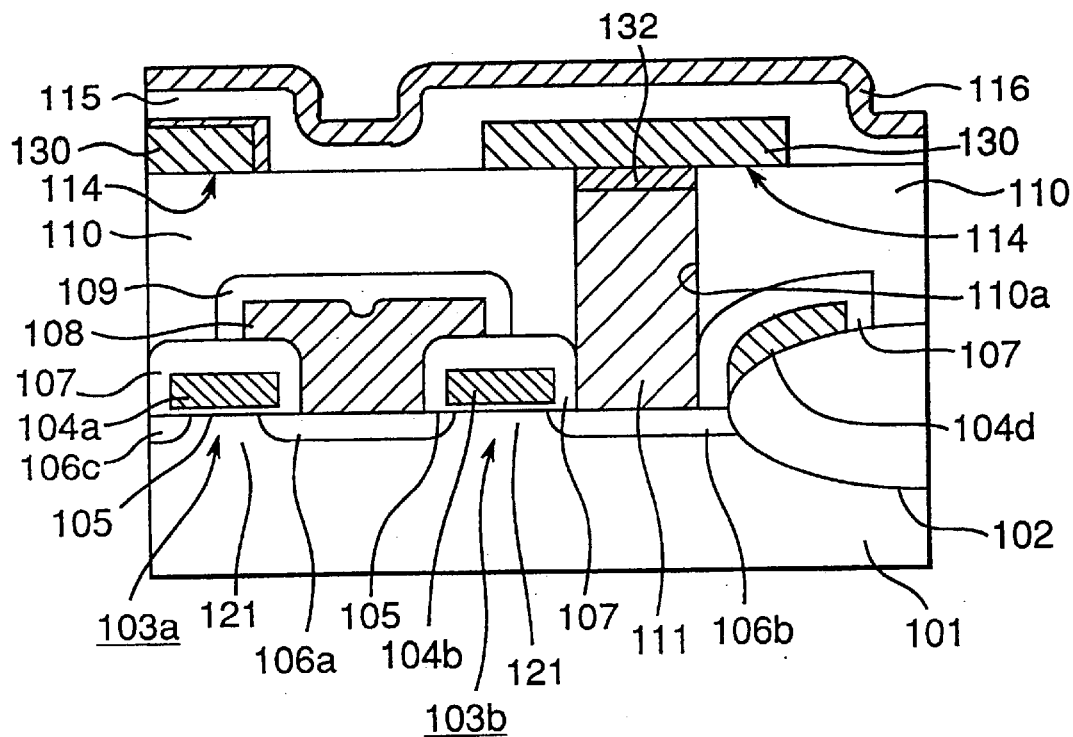
FIG. 10 is a partial cross sectional view showing a fourth step of another method of manufacturing the DRAM according to the third embodiment of the present invention.

Then, a SrTiO$_3$ film is deposited to serve as the capacitor dielectric film 115, as shown in FIG. 9 or 10. Then, ruthenium is deposited to serve as the upper electrode 116 of the capacitor. In the third embodiment, the CVD method is employed to form the capacitor dielectric film 115 in view of improving the characteristic covering the side surfaces of the lower electrode. Since the capacitor dielectric film 115 was formed under condition that the temperature of the substrate was 500° C. and the partial pressure of oxygen was 1 torr, the surface of the metal electrode 130 was not oxidized. Since oxidation of the surface of the metal electrode 130 was prevented, enlargement of the leakage current taking place due to roughening of the surface of the metal electrode 130 was prevented. A fact was confirmed that oxidation of the surface of the metal electrode 130 was prevented if the temperature of the substrate was 550° C. or lower or the partial pressure of oxygen was 15 torr or lower. Since the ruthenium electrode according to this embodiment was stable when the capacitor dielectric film was formed, no generation of a layer having a small dielectric constant took place in the interface. Thus, a reliable capacitor characteristic was managed to be realized. In the third embodiment, the ruthenium film serving as the upper electrode 116 of the capacitor was deposited by the sputtering method. The film thickness of the upper electrode 116 of the capacitor is the same as that of the metal electrode 130 formed by deposition. Thus, the upper electrode 116 of the capacitor is formed, and then pattering is performed to have a predetermined shape.

Figure 11:
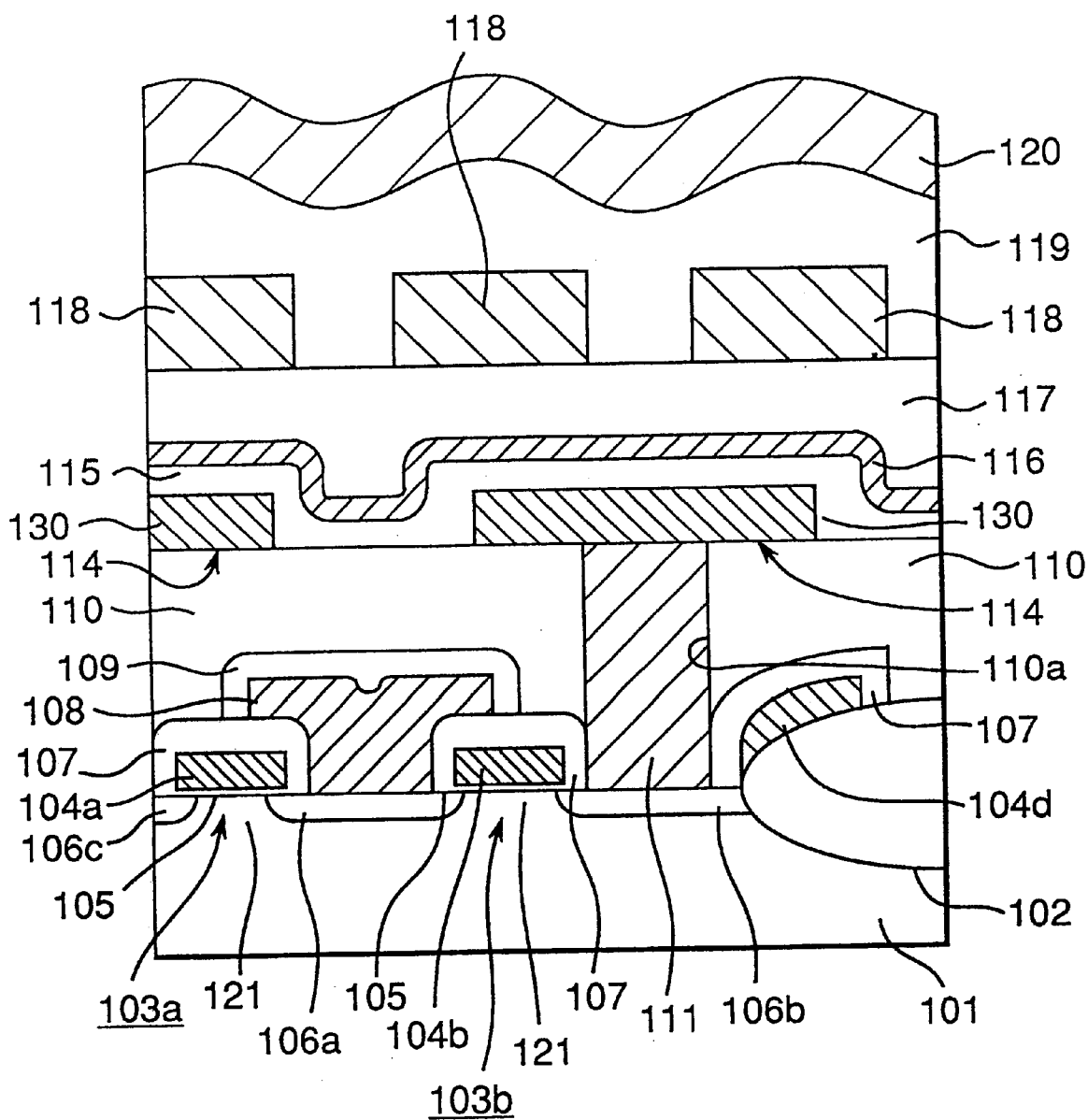
FIG. 11 is a partial cross sectional view showing a fifth step of the method of manufacturing the DRAM according to the third embodiment of the present invention.
Figure 12:
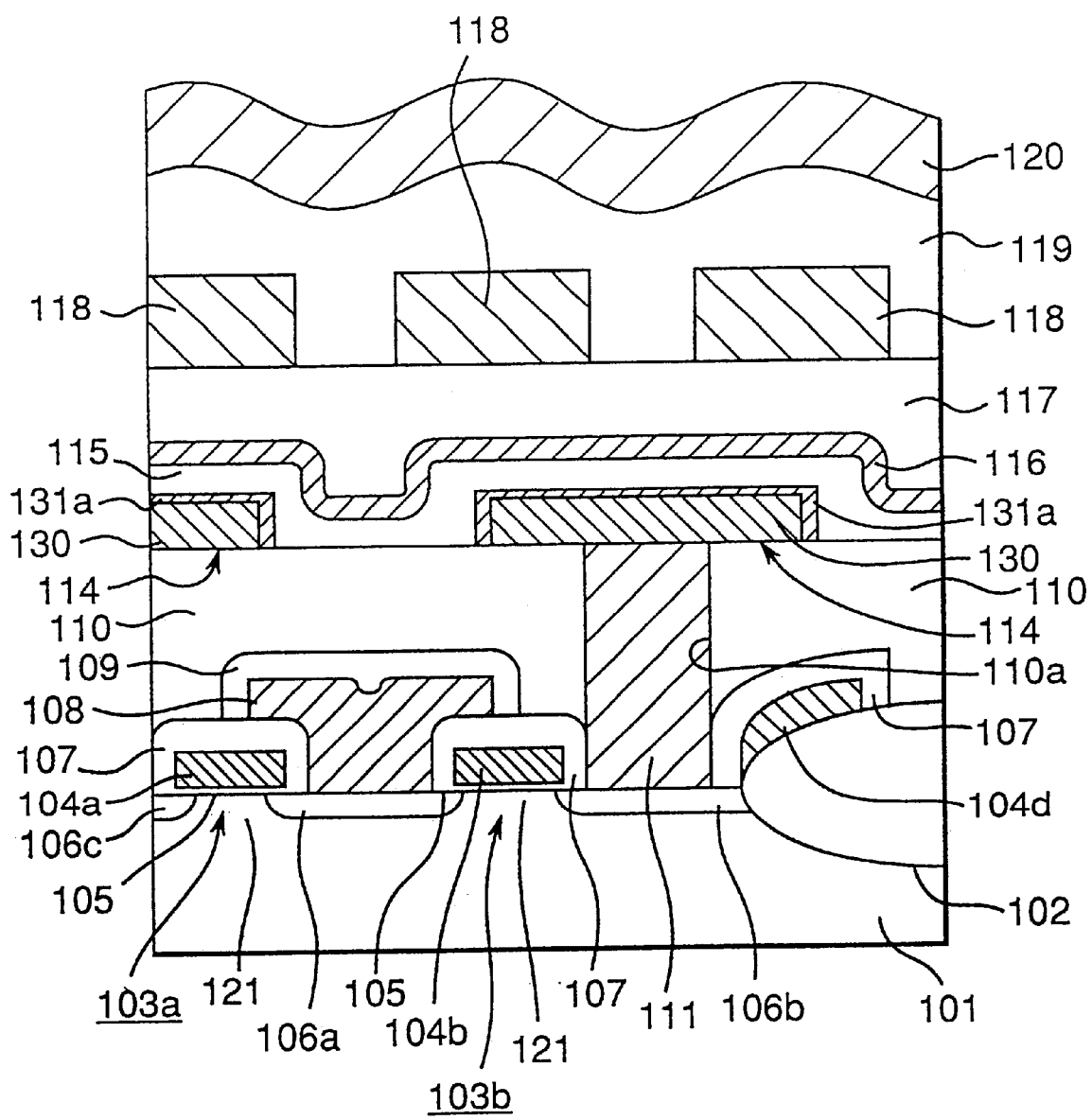
FIG. 12 is a partial cross sectional view showing a fifth step of another method of manufacturing the DRAM according to the third embodiment of the present invention.

Then, as shown in FIG. 11 or 12, the upper structure of the capacitor consisting of the second interlayer insulating film 117, the first aluminum line layer 118, the protective film 119, the aluminum line layer 120 and so forth is formed by a method similar to the conventional method so that the DRAM according to the third embodiment of the present invention is manufactured.

Since oxidation of the surface of the electrode was prevented when the capacitor dielectric film was formed, the structure of the cell was simplified. Since the lower electrode of the capacitor was made to be the metal electrode made of iridium or ruthenium, the electrode was enabled to be processed easily as compared with the conventional case where platinum was employed as the material to form the electrode. Since oxidation of the surface of the electrode when the capacitor dielectric film was formed was prevented, a stable characteristic of the capacitor was realized. Even if the surface of the metal electrode is roughened due to the heat treatment to be performed after the metal electrode has been formed, the flattening process employing the chemical and mechanical grinding method enabled enlargement of the leakage current to be prevented. In the case where the material, the major component of which was silicon, was employed to form the plug as is employed in the third embodiment, the metal electrode was managed to be connected through the silicide layer. Therefore, the contact resistance was managed to be reduced. As a matter of course, the present invention may effectively be adapted to a device except the DRAM, such as a device having a thin-film capacitor formed by a film having a large dielectric constant.

Fourth Embodiment

A method of manufacturing a semiconductor device according to a fourth embodiment of the present invention will now be described with reference to FIGS. 13 to 20. FIGS. 13 to 20 are partial cross sectional views showing a process for manufacturing (a method of manufacturing) a DRAM according to the fourth embodiment of the present invention.

Figure 13:
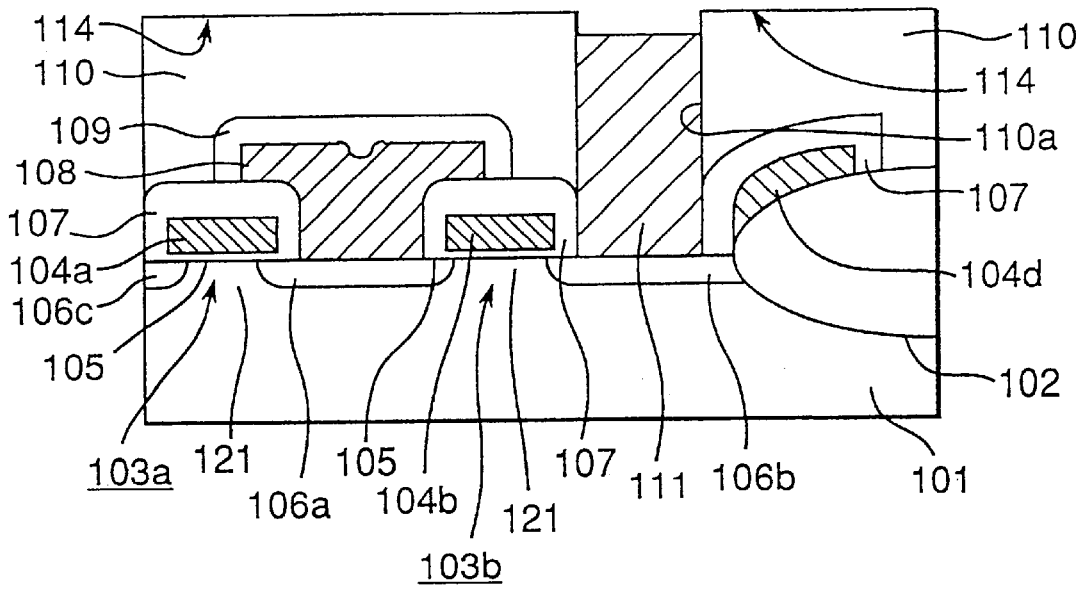
FIG. 13 is a partial cross sectional view showing a first step of the method of manufacturing a DRAM according to a fourth embodiment of the present invention.

Initially, a method similar to the conventional method is employed as shown in FIG. 13 so that the structure of the lower portion of the capacitor was formed which consists of the P-type semiconductor substrate 101, the field oxide film 102, the transfer gate transistors 103a and 103b, the N-type impurity regions 106a, 106b and 106c, the channel regions 121, the gate insulating film 105, the gate electrodes 104a, 104b and 104d, the oxide film 107, the buried bit line 108, the insulating layer 109, the first interlayer insulating film 110 and the contact hole 110a and so forth. A CVD method using SiH$_4$ gas is employed to plug the contact hole 110a and a polycrystal silicon layer formed to cover the first interlayer insulating film 110 and containing doped phosphorus is etched back by a RIE method or the like. To prevent the plug 111 being oxidized through the metal electrode 130 due to an oxidizing atmosphere when a capacitor dielectric film 115, to be described later, is formed, the top end of the plug 111 is made to be lower than the top surface of the first interlayer insulating film 110. A preferred extent of lowering is 30 nm to 500 nm. In the fourth embodiment, it was determined to be 50 nm. As a result, the plug 111 is formed in the contact hole 110a. Although the material of the plug 111 according to the fourth embodiment was silicon, metal, such as tungsten, titanium or tantalum, or their alloys or their nitrides may be employed.

Then, as shown in FIGS. 14 to 17, the process according to the third embodiment is employed to form the metal electrode 130, the capacitor dielectric film 115, the upper electrode 116 of the capacitor, the upper structure of the capacitor consisting of the second interlayer insulating film 117, the first aluminum line layer 118, the protective film 119, the aluminum line layer 120 and so forth. Thus, one DRAM according to the fourth embodiment of the present invention is manufactured. In the case where the adherence between the metal electrode 130 and the first interlayer insulating film 110 is unsatisfactory, the method, in which the adhesion layer 133 is formed, according to the first embodiment may effectively be employed.

Figure 14:
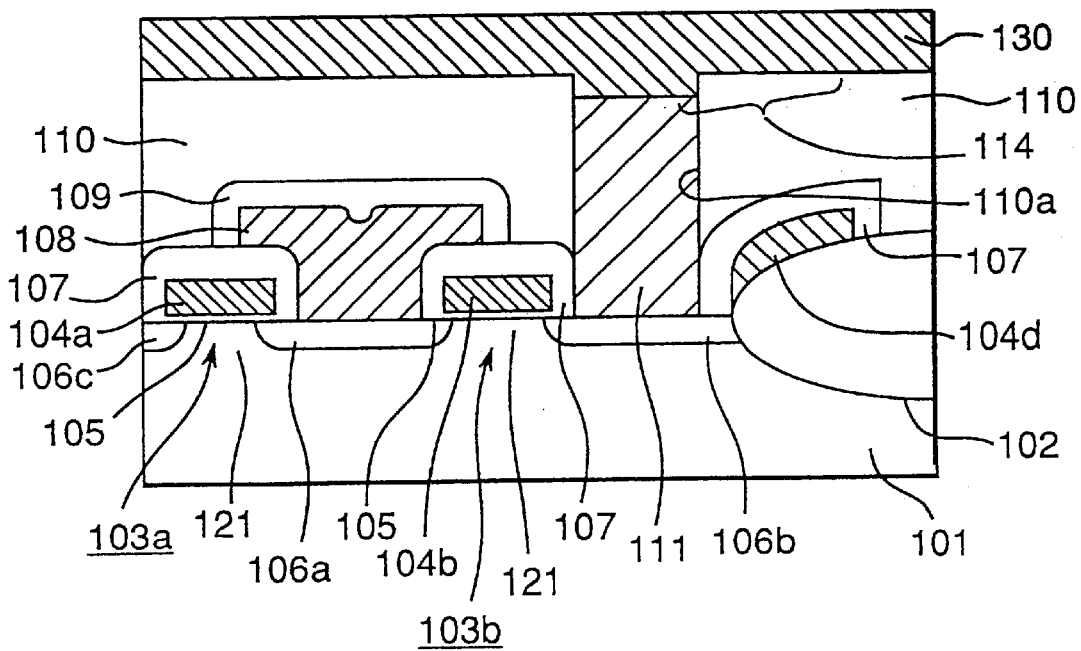
FIG. 14 is a partial cross sectional view showing a second step of the method of manufacturing the DRAM according to the fourth embodiment of the present invention.
Figure 15:
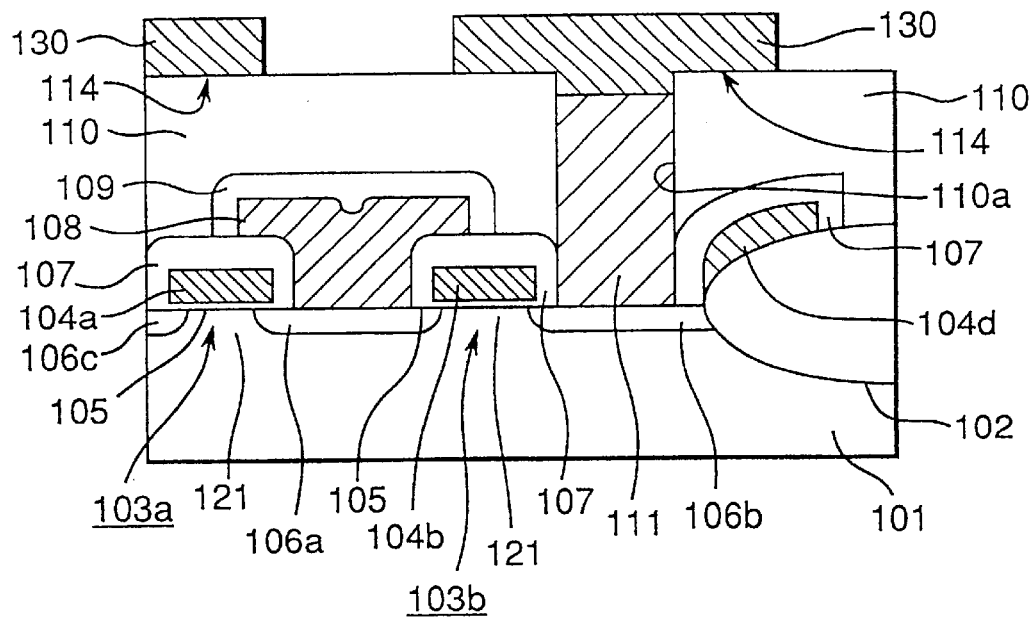
FIG. 15 is a partial cross sectional view showing a third step of the method of manufacturing the DRAM according to the fourth embodiment of the present invention.
Figure 16:
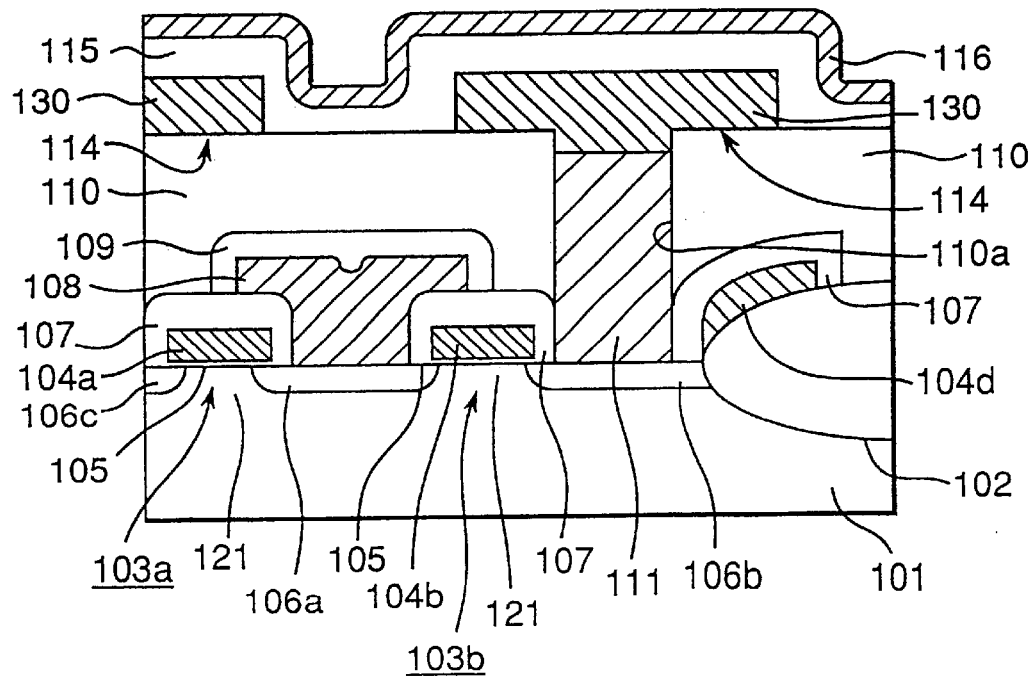
FIG. 16 is a partial cross sectional view showing a fourth step of the method of manufacturing the DRAM according to the fourth embodiment of the present invention.
Figure 17:
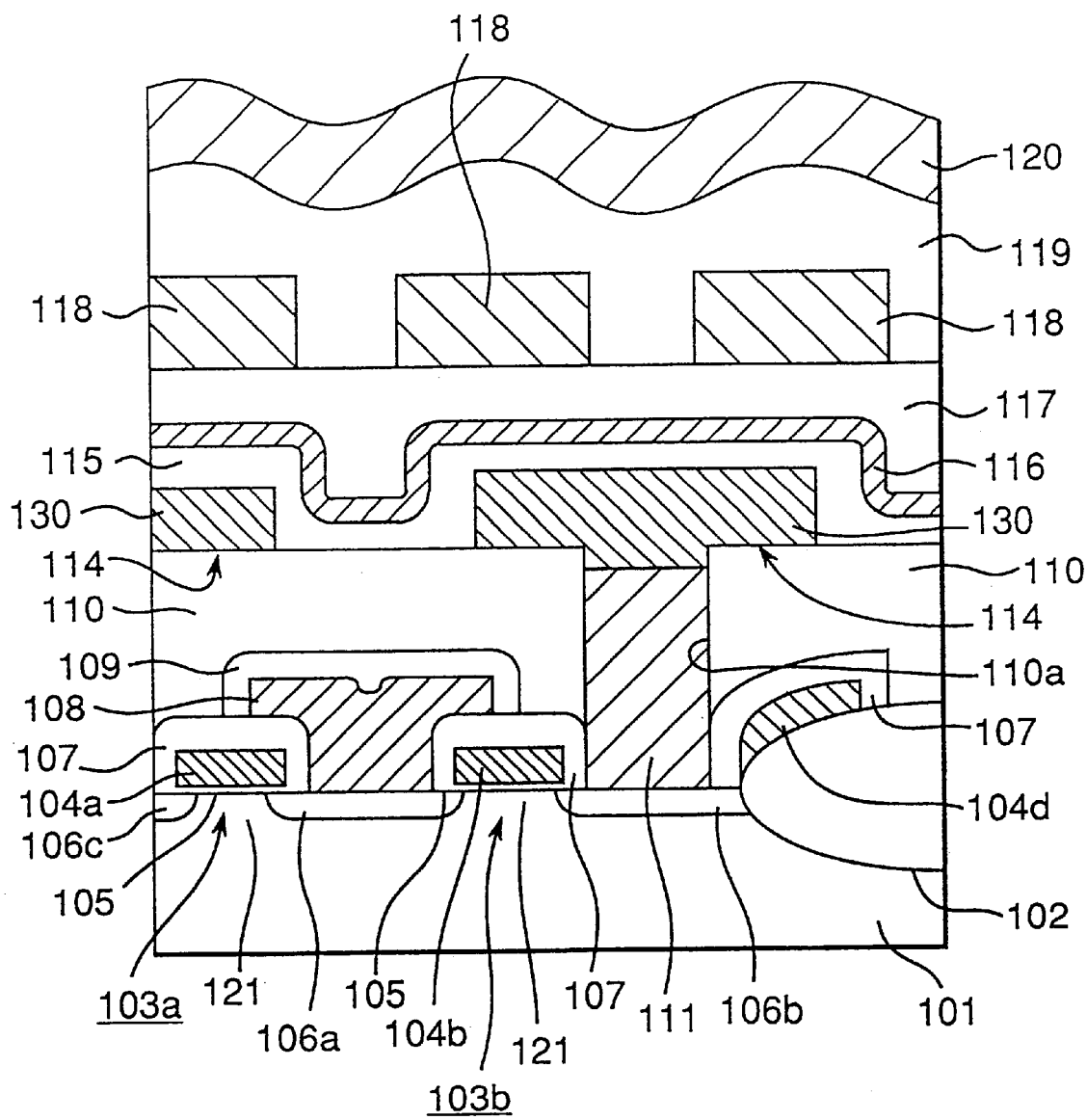
FIG. 17 is a partial cross sectional view showing a fifth step of the method of manufacturing the DRAM according to the fourth embodiment of the present invention.
Figure 18:
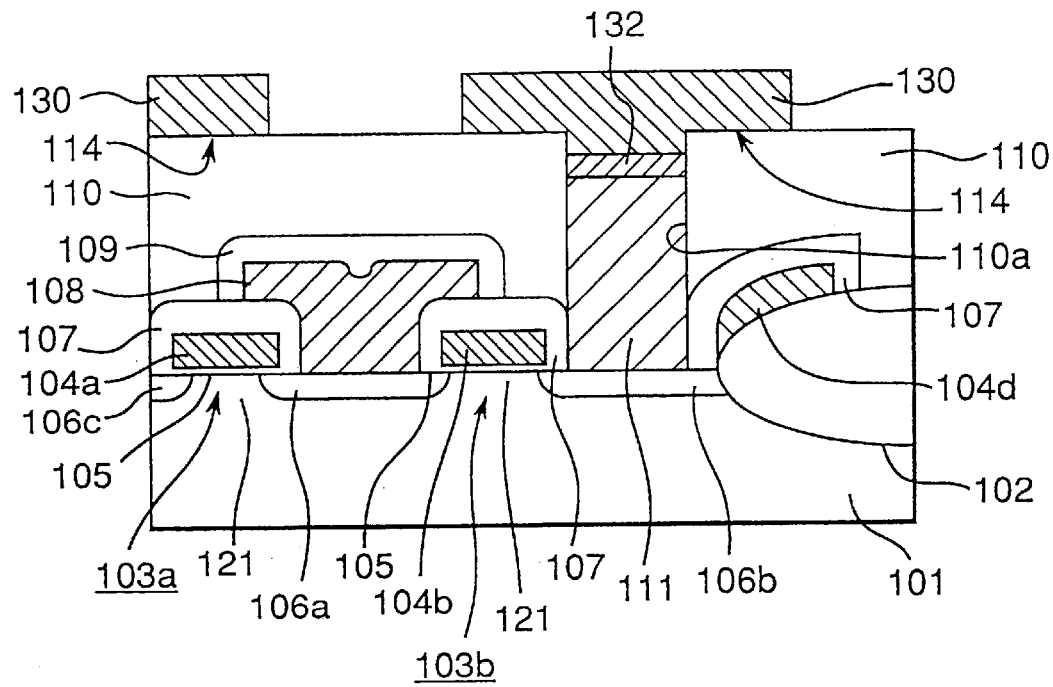
FIG. 18 is a partial cross sectional view showing another third step of the method of manufacturing the DRAM according to the fourth embodiment of the present invention.
Figure 19:
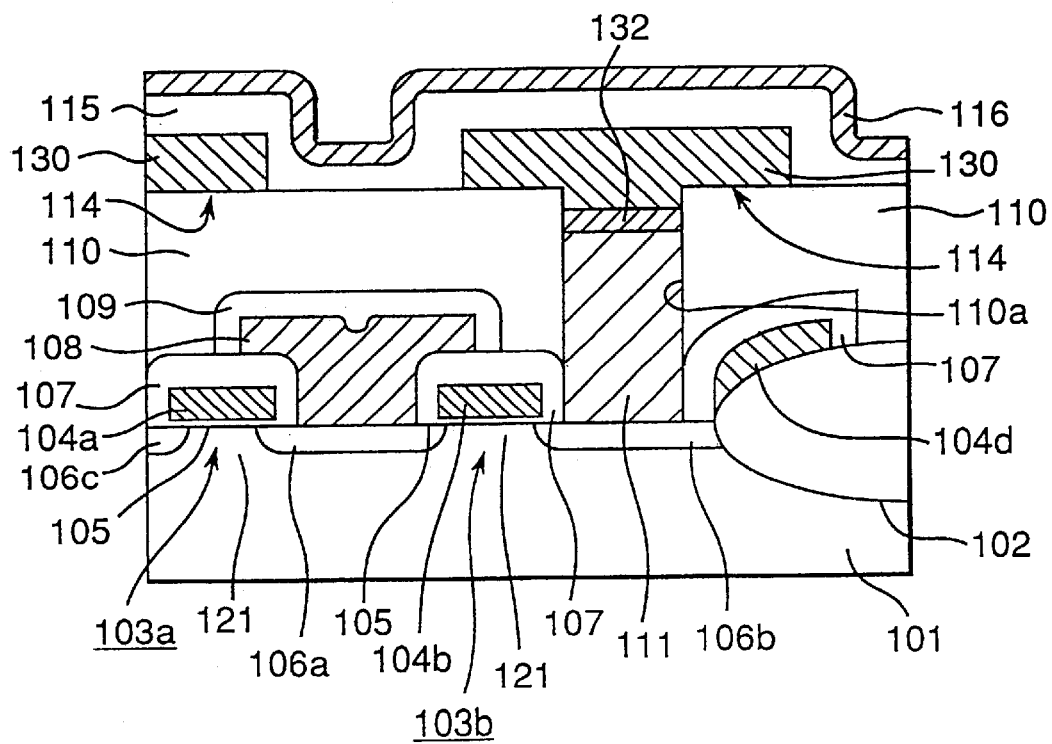
FIG. 19 is a partial cross sectional view showing another fourth step of the method of manufacturing the DRAM according to the fourth embodiment of the present invention.
Figure 20:
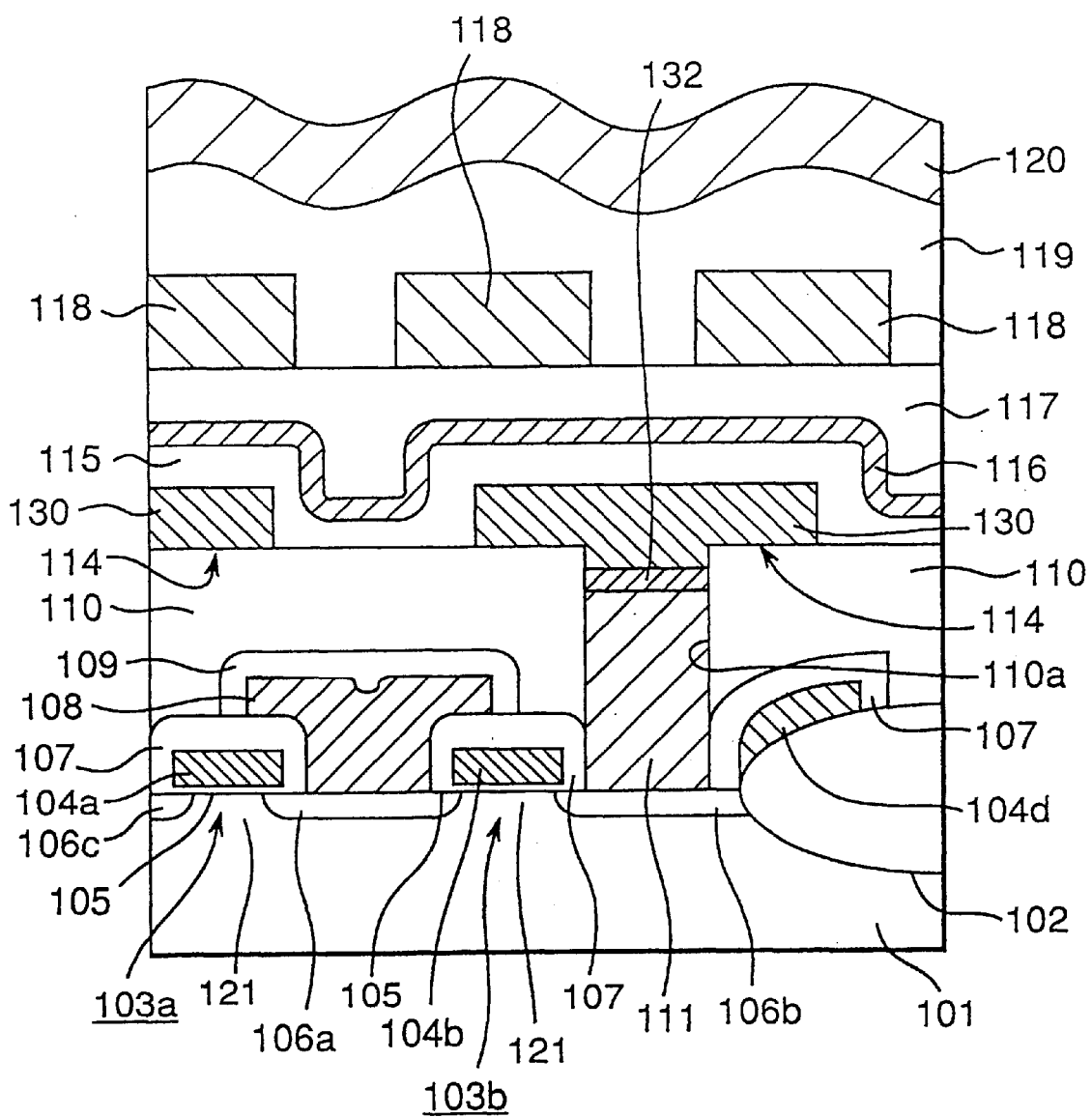
FIG. 20 is a partial cross sectional view showing another fifth step of the method of manufacturing the DRAM according to the fourth embodiment of the present invention.
Figure 21:
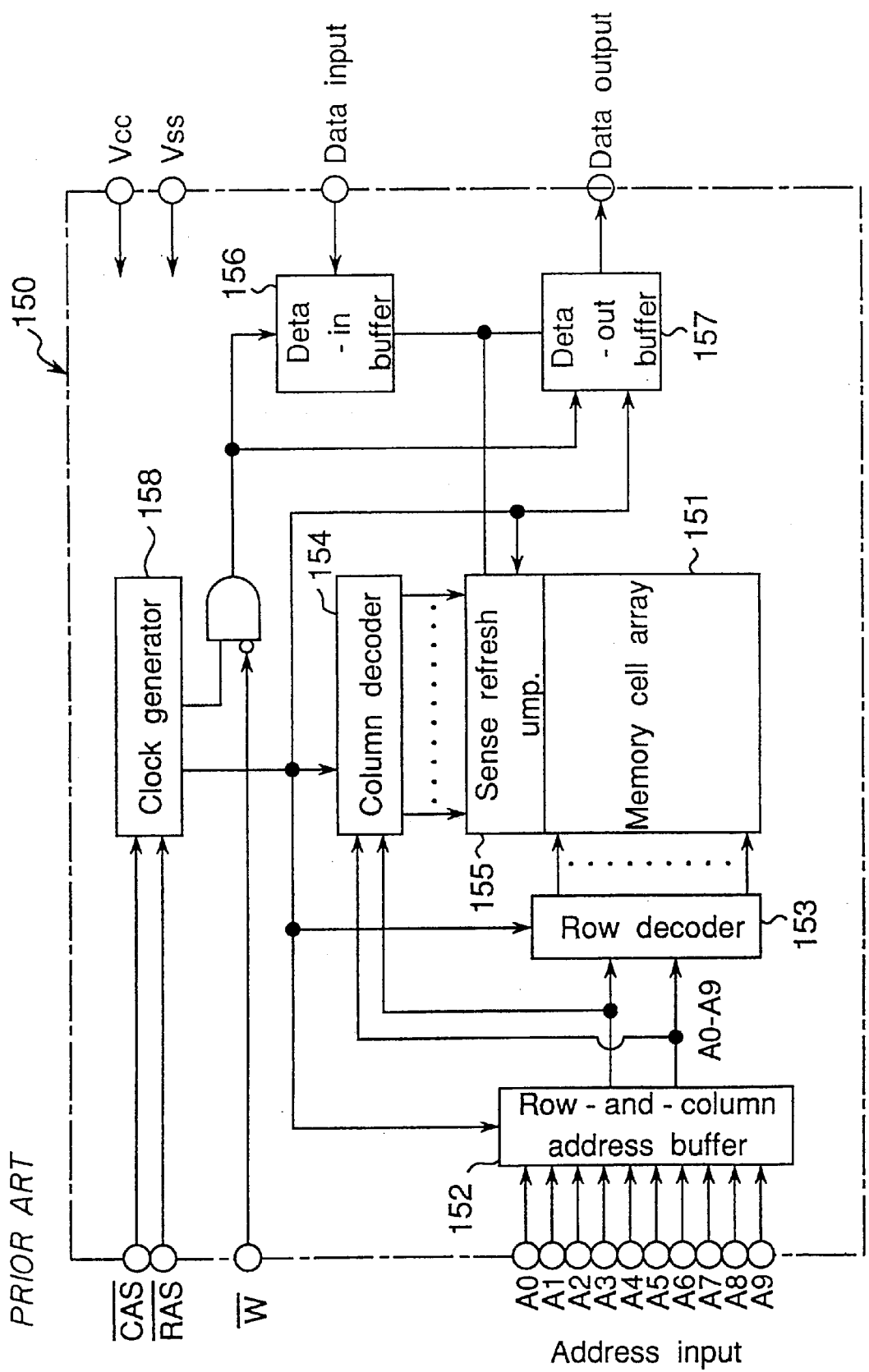
FIG. 21 is a block diagram showing the general structure of the DRAM.

In the case where the material, the major component of which is silicon, is selected to form the plug 111 as is employed in the fourth embodiment, the process shown in FIGS. 13 to 15 are performed. Then, as shown in FIG. 18, quick heat treatment is performed at 500° C. to 800° C. for 60 seconds so that a portion of the metal electrode is formed into metal silicide. In the fourth embodiment, a ruthenium silicide layer having a thickness of 10 nm was formed. It is preferable that the film thickness of the silicide layer be 50 nm or smaller. By forming a portion of the metal electrode into the silicide layer, a further stable contact can be formed and the contact resistance can be reduced. As has been suggested in the first embodiment, in a case where the adhesion layer is formed between the first interlayer insulating film 110 and the metal electrode 130, a silicide layer is sometimes formed due to reaction between the adhesion layer and silicon in the plug 111. Note that a fact was confirmed that the formed silicide layer did not raise a problem and the electrical resistance between the lower electrode 114 of the capacitor and the substrate was able to be reduced. After the foregoing process has been completed, as shown in FIGS. 19 and 20, the capacitor dielectric film 115, the upper electrode 116 of the capacitor, and the upper structure of the capacitor consisting of the second interlayer insulating film 117, the first aluminum line layer 118, the protective film 119, the aluminum line layer 120 and so forth are formed. Thus, another DRAM according to the fourth embodiment of the present invention can be manufactured.

In a case where ruthenium to form the metal electrode 130 is, after the process shown in FIG. 15, subjected to heat treatment at temperatures higher that the temperature at which the ruthenium film is formed the surface of the ruthenium film is sometimes roughened and the leakage current is sometimes enlarged. In this case, a chemical and mechanical grinding method may be employed to flatten the surface, as shown in FIG. 14. If the process for flatting the surface by the chemical and mechanical grinding method is not performed, a large leakage current of 10 mA or more per square centimeter was generated. When the surface was flattened by the foregoing method, a leakage current of 45 nA per square centimeter resulted when voltage of 1 V was applied. Thus, no enlargement of the leakage current was confirmed as compared with 45 nA per square centimeter realized in a case where a flat metal film electrode was deposited.

Since oxidation of the surface of the electrode was prevented when the capacitor dielectric film was formed, the structure of the cell was simplified. Since the lower electrode of the capacitor was made to be the metal electrode made of iridium or ruthenium, the electrode was enabled to be processed easily as compared with the conventional case where platinum was employed as the material to form the electrode. Since oxidation of the surface of the electrode when the capacitor dielectric film was formed was prevented, a stable characteristic of the capacitor was realized. Even if the surface of the metal electrode is roughened due to the heat treatment to be performed after the metal electrode has been formed, the flattening process employing the chemical and mechanical grinding method enables enlargement of the leakage current to be prevented. Since the top end of the plug is made to be lower than the top surface of the interlayer insulating film, oxidation of silicon of the plug through the metal electrode taking place when the capacitor dielectric film is formed can be prevented. In the case where the material, the major component of which is silicon, is employed to form the plug, the metal electrode was managed to be connected through the silicide layer. Therefore, the contact resistance was able to be reduced. As a matter of course, the present invention may effectively be adapted to a device except the DRAM, such as a device having a thin-film capacitor formed by a film having a large dielectric constant.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A semiconductor device comprising:
   a substrate having a major surface;
   an interlayer insulating film formed on said major surface of said substrate and having openings therein which reach said major surface;
   connection members disposed within said openings;
   a capacitor including lower capacitor electrodes, a dielectric film made of a high dielectric material and formed by a Chemical Vapor Deposition (CVD) method on said lower capacitor electrodes, and an upper capacitor electrode deposited on said dielectric film;
   each of said lower capacitor electrodes being separated from each other and being electrically connected with said major surface through said connection members;
   each of said lower capacitor electrodes being in the form of a metal electrode made mainly from ruthenium, said lower capacitor electrodes connecting directly to said dielectric film without a layer of oxide formed on a surface of said lower capacitor electrodes during formation of said dielectric film being in contact with said interlayer insulating film between said lower capacitor electrodes;
   a top surface of each of said connection members being formed at a certain level equal to or lower than the upper surface of said interlayer insulating film; and
   said lower capacitor electrodes being in direct contact with said connection members, such that no diffusion barrier is provided between said metal electrodes made mainly from ruthenium and said connection members.

2. A semiconductor device according to claim 1, wherein the top end of said connection member is lower than the upper surface of said interlayer insulating film by at least 30 nm.

3. A semiconductor device according to claim 1, wherein the dielectric film is formed by said CVD method at a temperature equal to or less than 550° C. and at a partial pressure of oxygen equal to or less than 15 torr.

4. A semiconductor device according to claim 1, wherein the lower capacitor electrodes are separated by reactive ion etching method.

5. A semiconductor device according to claim 1, wherein the lower capacitor electrode is made of ruthenium.

6. A semiconductor device according to claim 2, wherein a portion of each capacitor lower electrode is embedded in one of said openings so that the capacitor lower electrode is connected to the top end of a corresponding connection member.

7. A semiconductor device according to claim 1, wherein the top end of said connection member is lower than the upper surface of said interlayer insulating film.

* * * * *

UNITED STATES PATENT AND TRADEMARK OFFICE
CERTIFICATE OF CORRECTION

PATENT NO.    : 6,239,460 B1
DATED         : May 29, 2001
INVENTOR(S)   : Kuroiwa et al.

It is certified that error appears in the above-identified patent and that said Letters Patent is hereby corrected as shown below:

Please replace Drawing Sheets 6, 7, and 9 with the attached replacement sheets.

<u>Column 12,</u>
Line 47, please delete the formula and replace with the following formula:
-- $Ru(C_5H_5)_2$, $Ru(DPM)_3$, $Ru_3(CO)_{12}$ --

Signed and Sealed this

Twenty-eighth Day of October, 2003

JAMES E. ROGAN
*Director of the United States Patent and Trademark Office*